US007095860B1

(12) United States Patent
Kemp

(10) Patent No.: US 7,095,860 B1
(45) Date of Patent: Aug. 22, 2006

(54) AUDIO DYNAMIC CONTROL EFFECTS SYNTHESIZER WITH OR WITHOUT ANALYZER

(76) Inventor: Michael Joseph Kemp, S. Marcos da Serra, P-8375, Vale Formosilho (PT)

( * ) Notice: Subject to any disclaimer, the term of this patent is extended or adjusted under 35 U.S.C. 154(b) by 0 days.

(21) Appl. No.: 09/831,596

(22) PCT Filed: Nov. 11, 1999

(86) PCT No.: PCT/GB99/03753

§ 371 (c)(1),
(2), (4) Date: Aug. 22, 2001

(87) PCT Pub. No.: WO00/28521

PCT Pub. Date: May 18, 2000

(30) Foreign Application Priority Data

Nov. 11, 1998 (GB) ................................ 9824776.0

(51) Int. Cl.
*H03G 3/00* (2006.01)
*H03G 9/00* (2006.01)

(52) U.S. Cl. ........................................ 381/61; 381/102

(58) Field of Classification Search ................ 381/104, 381/107, 94.4, 106, 109, 98, 101, 103, 102; 700/94
See application file for complete search history.

(56) References Cited

U.S. PATENT DOCUMENTS

| | | | | |
|---|---|---|---|---|
| 3,519,724 | A | 7/1970 | Cookerly et al. | |
| 4,490,843 | A * | 12/1984 | Bose et al. | 381/102 |
| 5,386,082 | A * | 1/1995 | Higashi | 84/630 |
| 5,471,651 | A * | 11/1995 | Wilson | 455/72 |
| 5,578,948 | A | 11/1996 | Toyama | |
| 5,744,742 | A * | 4/1998 | Lindemann et al. | 84/623 |
| 5,748,747 | A * | 5/1998 | Massie | 381/61 |
| 5,784,476 | A * | 7/1998 | Bird | 381/107 |
| 5,841,875 | A * | 11/1998 | Kuroki et al. | 381/61 |
| 5,896,064 | A * | 4/1999 | Kaku | 330/279 |
| 5,923,767 | A * | 7/1999 | Frindle et al. | 381/106 |
| 5,930,733 | A * | 7/1999 | Park et al. | 702/76 |
| 6,055,502 | A * | 4/2000 | Kitamura | 704/500 |
| 6,084,974 | A * | 7/2000 | Niimi | 381/104 |
| 6,088,461 | A * | 7/2000 | Lin et al. | 381/104 |
| 6,307,900 | B1 * | 10/2001 | Choi | 375/341 |
| 6,519,342 | B1 * | 2/2003 | Opitz | 381/61 |

FOREIGN PATENT DOCUMENTS

| | | |
|---|---|---|
| FR | 2 257 173 | 8/1975 |
| GB | 2 258 099 | 1/1993 |

* cited by examiner

*Primary Examiner*—Xu Mei
(74) *Attorney, Agent, or Firm*—Wolf, Greenfield & Sacks, P.C.

(57) ABSTRACT

A method and apparatus for applying a gain characteristic to an audio signal are provided. Data storing a plurality of gain characteristics at a plurality of different levels is stored in a storage means. The amplitude of an input signal is repeatedly assessed and from this a gain characteristic to be applied to the input is determined.

16 Claims, 31 Drawing Sheets

FIG. 4(a)

TABLE OF OUTPUT LEVEL TEST DATA FOR TRANSFER CURVE OF 'IDEAL' COMPRESSOR

| INPUT / RATIO | 1.5:1 | 5:1 | 20:1 |
|---|---|---|---|
| -40dBm | -33.3 | -33.3 | -33.3 |
| -39dBm | -32.3 | -32.3 | -32.3 |
| -38dBm | -31.3 | -31.3 | -31.3 |
| ... | | | |
| -30dBm | -23.3 | -23.3 | -23.3 |
| ... | | | |
| -20dBm | -13.3 | -13.3 | -13.3 |
| ... | | | |
| -10dBm | -6.7 | -11.3 | -12.8 |
| ... | | | |
| -2dBm | -1.3 | -9.7 | -11.9 |
| -1dBm | -0.7 | -9.5 | -11.95 |
| 0dBm | 0.0 | -9.3 | -11.8 |

FIG. 4(b)

TABLE OF OUTPUT LEVEL TEST DATA FOR TRANSFER CURVE OF 'TYPICAL' COMPRESSOR

| INPUT / RATIO | 1.5:1 | 5:1 | 20:1 |
|---|---|---|---|
| -40dBm | -35.5 | -35.7 | -35.5 |
| -39dBm | -34.5 | -34.6 | -34.5 |
| -38dBm | -33.4 | -33.5 | -33.4 |
| ... | | | |
| -30dBm | -24.9 | -25.5 | -27.2 |
| ... | | | |
| -20dBm | -16.3 | -17.5 | -19.2 |
| ... | | | |
| -10dBm | -11.2 | -13.4 | -15.8 |
| ... | | | |
| -2dBm | -1.7 | -11.7 | -12.8 |
| -1dBm | -1.1 | -11.6 | -12.8 |
| 0dBm | -0.3 | -11.5 | -12.7 |

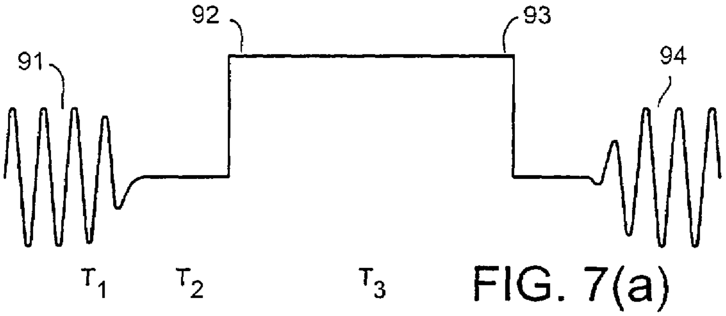
FIG. 7(a)
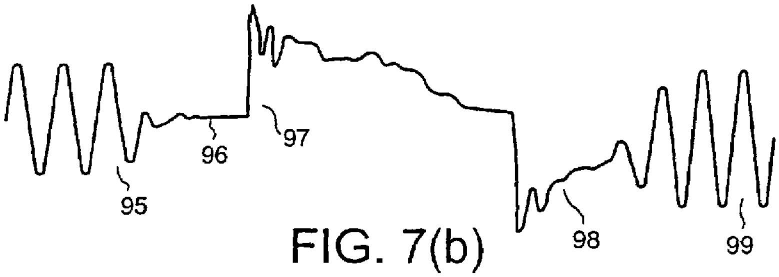
FIG. 7(b)
REDUCE TEST OUTPUT LEVEL T0 -20dBm — 80
↓
RECORD RETURN LEVEL AT INTERVALS T UNTIL VARIATION IS LESS THAN 0.1dB FOR PERIOD OF TYPICALLY 1 SECOND — 81
↓
INCREASE TEST OUTPUT TO 0dBm — 82
↓
RECORD RETURN LEVEL AT INTERVALS T UNTIL VARIATION IS LESS THAN 0.1dB FOR PERIOD OF TYPICALLY 1 SECOND — 83
↓
DONE
FIG. 8

Fig 3a PA
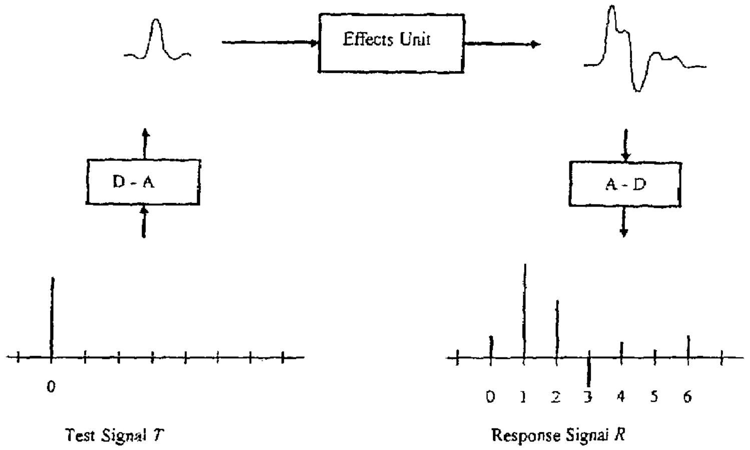
Fig 3b PA
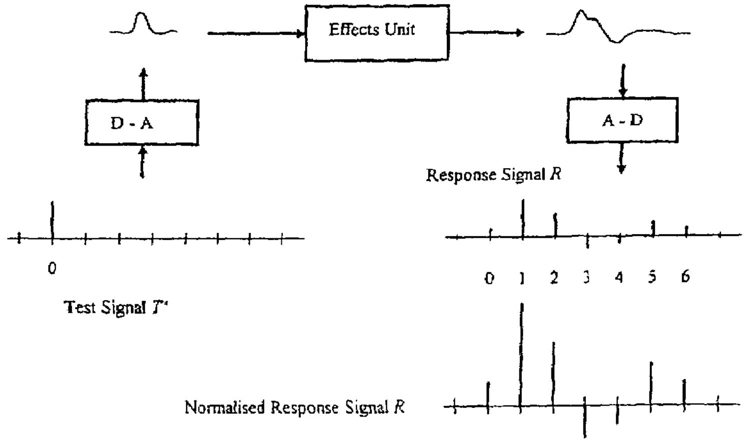

AUDIO DYNAMIC CONTROL EFFECTS SYNTHESIZER WITH OR WITHOUT ANALYZER

Patent Application PCT GB97/02159 (WO98/07141) (The "Prior Application") describes an audio effects synthesizer with or without analyzer and should be read along with this description of further improvements. To facilitate such reading, a copy of most of the Prior Application has been reproduced at the end of this specification and references to the Prior Application may equally be understood to refer to the portion of this specification under the heading "Prior Application."

The purpose of this invention is to store the characteristics of audio level control devices which have audibly desirable properties and to be able to synthesise these properties at will.

SUMMARY OF FIGURES

FIGS. 1PA–21PA are copies of Figures from the Prior Application and they are more fully described in the section titled "Prior Application."

CHARACTERISTICS OF A DYNAMIC RANGE CONTROLLING DEVICE

Figure 1:
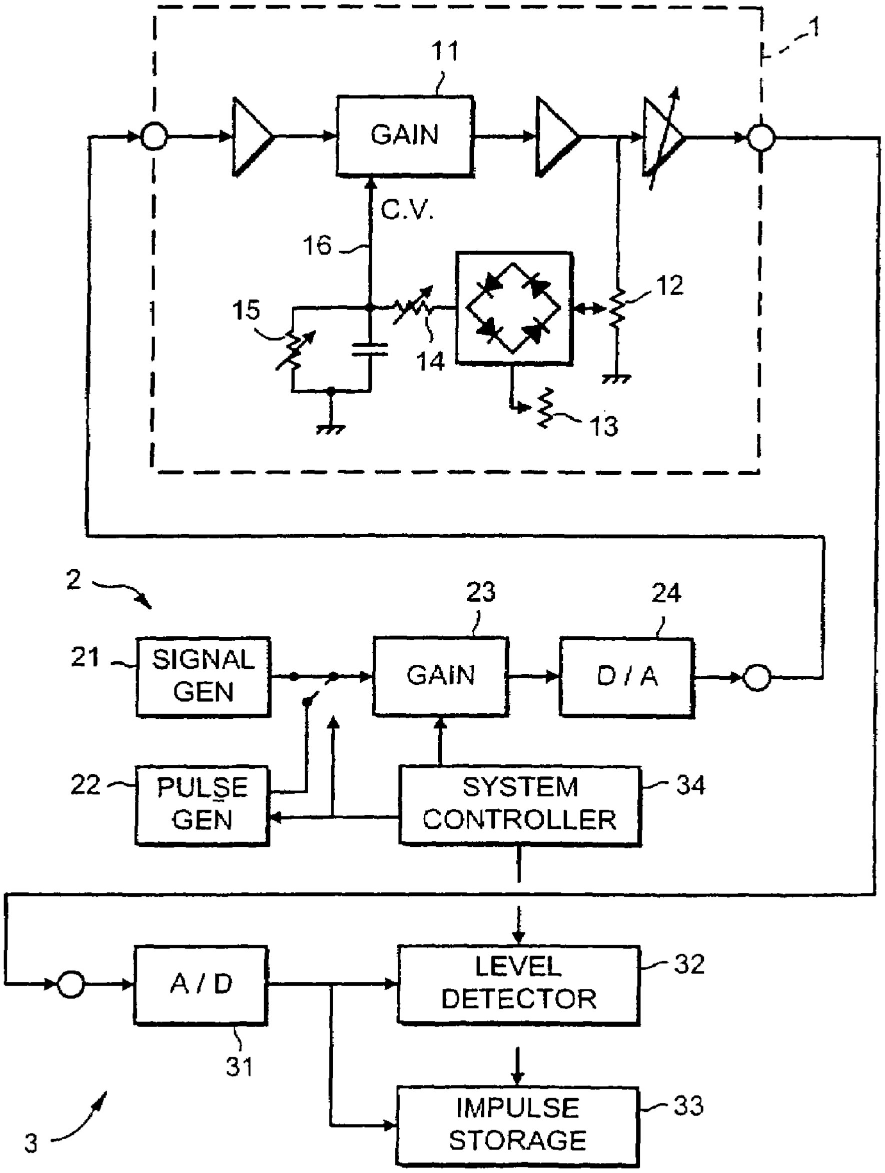
FIG. 1 shows an analysis arrangement for a device under test (D.U.T.).
Figure 2A:
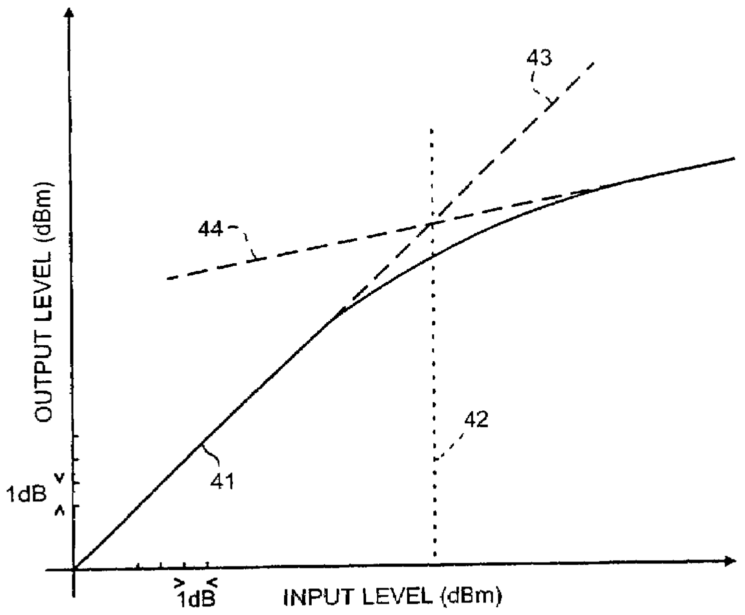
FIG. 2 illustrates two characteristics of a compressor device namely the gain characteristic and the time dependent characteristic.
Figure 2B:
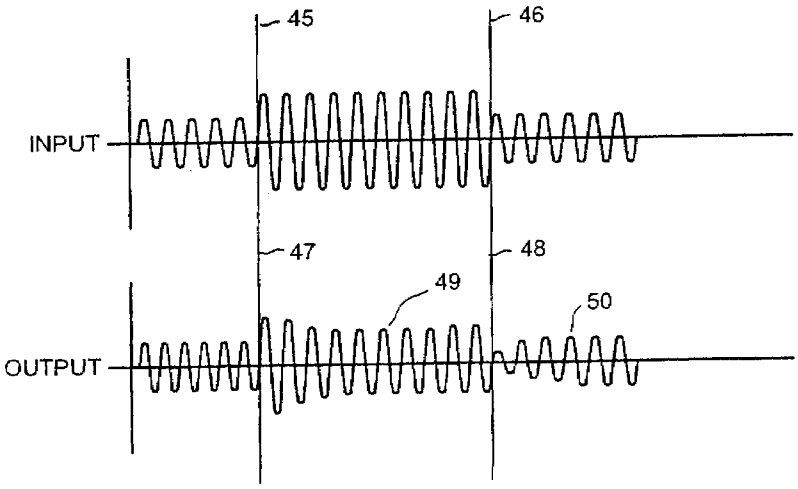

FIG. 1 shows a typical arrangement of an audio compressor device 1 (in this case, the device under test, also referred to as the "reference device"), being driven by a signal generating arrangement 2, and being analyzed by the signal analysis arrangement 3.

A compressor is designed to reduce the dynamic range of audio program material by reducing the amplitude of louder passages in relation to that of quieter passages. In a typical compressor as shown at 1, the input signal is fed (often with some pre-amplification and or variable attenuation) to a gain control element 11. This alters the amplitude of the signal which is then fed again usually via some amplification or buffering to the output where there is usually some additional variable gain available to compensate for attenuation in the overall signal path.

Some of the output signal is usually fed to a rectification circuit where controls 12 and 13 select a threshold above which gain reduction is to be effected and an amount or ratio by which gain is to be reduced according to the output signal. The rectified signal is further applied to a time constant arrangement where controls 14 and 15 apply attack and recovery time constants by which gain is reduced and restored when the output signal increases or decreases.

Note that there are a number of variations possible in this arrangement and also it is possible to rearrange the gain control circuitry so that dynamic range expansion is produced or so that signal gating may occur. These do not affect the operation of the analysis device.

The operation of the device under test is determined by the signal generating arrangement 2 comprising the choice of a continuous signal generator 21 or a pulse generator 22 fed to a variable gain control element 23 and then to the device under test via a digital to analogue converter 24.

Note that the D-A converter may be omitted if the device under test is actually a digital device or if the signal generating arrangement is implemented in analogue circuitry. For the rest of this discussion the assumption is that the device under test is analogue and the analysis and synthesis device is digital.

The output of the device under test is fed to the signal analysis arrangement 3 comprising an analogue to digital converter 31 and the choice of level detection circuitry 32 and impulse storage circuitry 33.

The entire analysis arrangement is controlled by system controller 34 which is typically a data processing arrangement which may share processing hardware with various elements of the complete analysis and synthesis system.

Figure 2:
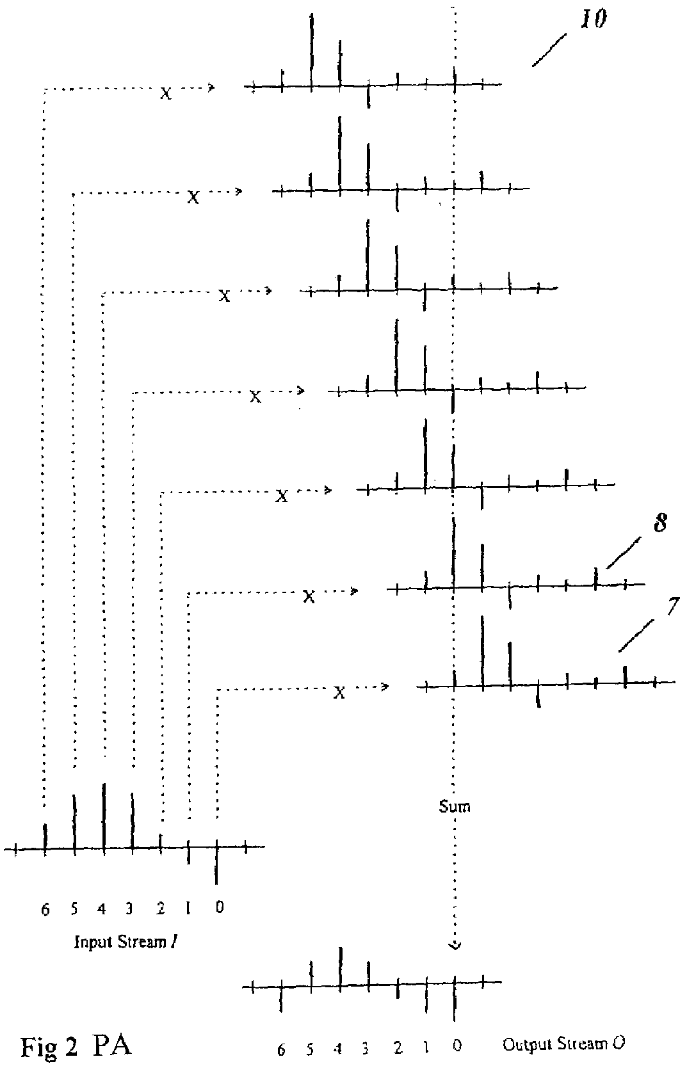

FIG. 2 shows the main characteristics of the device under test to be assessed.

FIG. 2 (*a*) shows the gain characteristic of a typical compressor. Curve 41 shows the relationship between the input level of a signal fed to the device and the resulting output at a particular setting of the controls. It can be seen that at low levels the output rises linearly in proportion to the input, along the dotted line 43 such that a 1 dB increase in input results in a 1 dB increase in output.

As the input level approaches the threshold setting 42 the gain begins to modify to approach that of line 44 which represents the ratio or slope of the compressor. This may be for example that it requires a 3 dB increase in input to produce a 1 dB increase in output (a ratio of 3:1). There is usually no sudden transition at the threshold and the degree of 'softness' of the knee of the curve is one distinguishing characteristic of a particular compressor. It is also possible to have multiple thresholds between multiple ratios.

FIG. 2 (*b*) shows the time constant characteristic of a typical compressor. The input signal is shown as a continuous sine wave which doubles in amplitude (increases by 6 dB) at 45 and then decreases by 6 dB at 46. The corresponding output shows that the there is an initial increase by 6 dB at 47 following which the gain is reduced according to the attack time constant until it reaches an essentially stable reduced gain at 49 determined from the curve of part (a). When the input signal reduces by 6 dB the output also reduces immediately by 6 dB at 48 then the gain is increased according to the release time constant until the appropriate gain for the input as determined by the curve in part (a) is restored by point 50.

Time constants are typically operator variable and the range and options provided by a particular device contribute to the user perceived operability of the device and to the audible characteristics of the device under test. However it is not essential to measure these characteristics as a standard set of time constants can be provided which are common to most devices to be simulated. In the event that it is desired to assess this characteristic of a device under test to more closely simulate a specific device the method is described below.

The third characteristic that determines the audible effect of a gain control device is the distortion or non-linearity caused by the gain control element. This may be assessed using the means of The Prior Application with some small modifications as set out below.

Analysis of the Gain Characteristic.

To properly analyse a device under test to determine its gain characteristic it is necessary to take at least one set of measurements corresponding to a specific setting of the ratio control on the device. As is described later the characteristic of other ratios may be interpolated between any pair of measured ratio characteristics and it is also possible to further interpolate between a measured ratio characteristic and an ideal 1:1 (no compression) and infinity:1 (limiting compression) characteristic.

In this example three sets of measurements are taken, for example for a ratios of 1.5:1, 5:1 and 20:1 (although any value or values spanning commonly used ratios may be chosen). To take each set of measurements the attack and decay settings of the device should each be set to either their maximum settings or to 1 second, whichever is shorter.

To take the set of measurements corresponding to the ratio of 1.5:1, this setting is selected on the device under test, and if a threshold control is available this is set to −20 dB, and the signal generator of FIG. 1 is set to generate a 1 kHz sine wave tone (although other frequencies may be used as described later) at a typical operating level for the device, chosen to be suitably below the overload limit of the device. For a professional unit a level of 0 dBm is appropriate. If available any make-up or output gain of the device under test should now be adjusted so that the level returned to the level detector of FIG. 1 is also at 0 dBm once the gain of the device under test has reached a steady state. If such an output adjustment is not available and this level is not achievable it is permissible to use any appropriate output level from the device.

Figure 3:
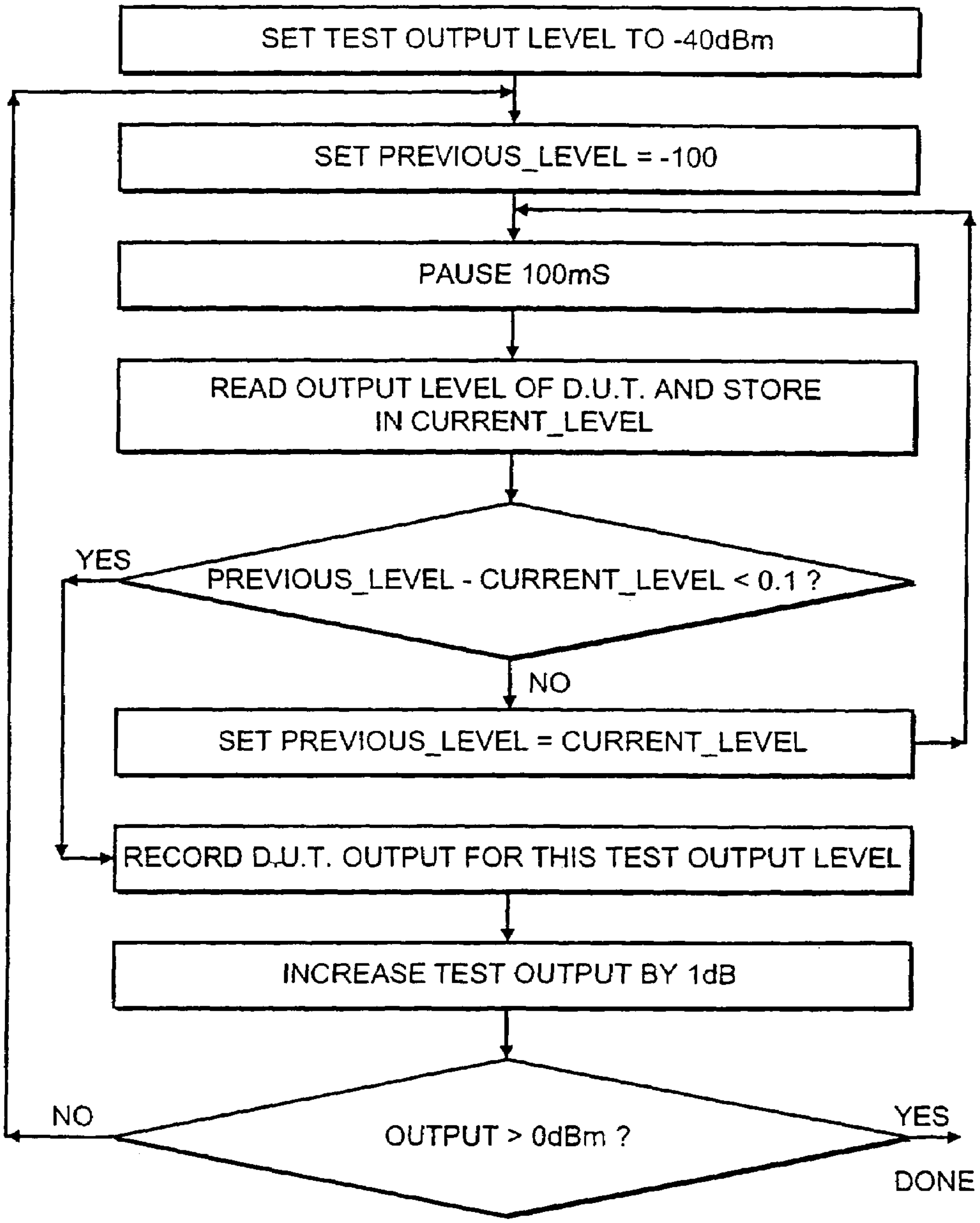
FIG. 3 shows a flow diagram of the process of analysing the gain characteristic of a D.U.T.
Figure 5A:
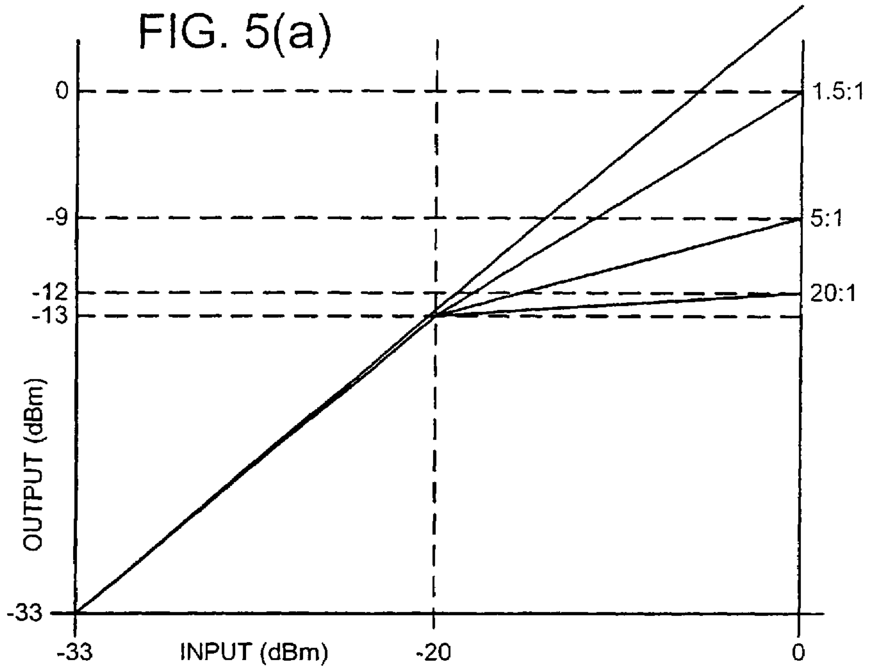
FIG. 5 shows graphically the values of FIG. 4.
Figure 5B:
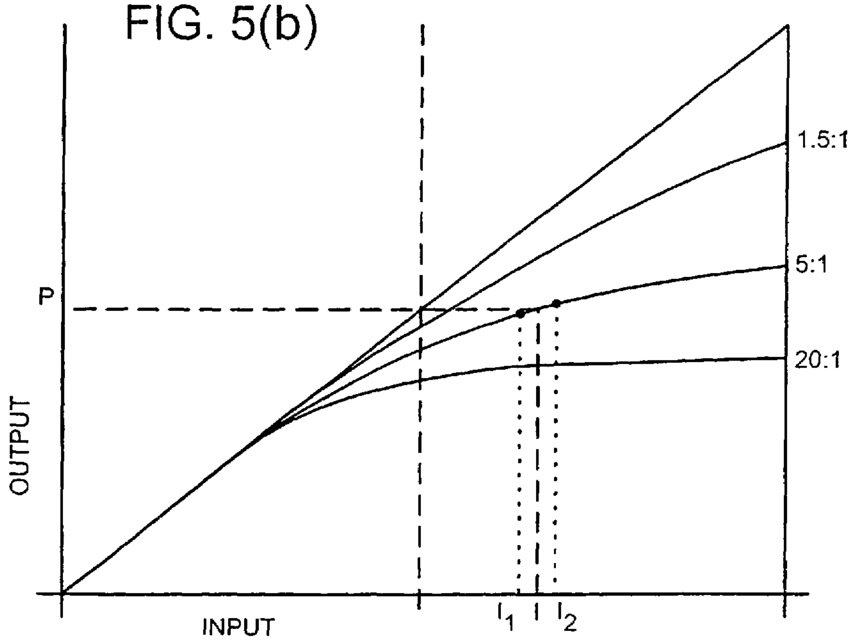

FIG. 3 shows a flow diagram of the test procedure which the signal generator and level detector conduct under computer control once the above conditions are set up. A sequence of measurements are taken for signals fed to the device under test between −40 dBm and 0 dBm at 1 dB intervals. As each level generated is set up, the output level from the device under test is repeatedly assessed until this level becomes stable to within 0.1 dB over a 100 mS interval. The output level is then recorded for this input level.

The amplitude interval with which the tests are conducted is dependent on the accuracy required in the simulations. The 1 dB steps described give good results for most applications but if there are time constraints on taking the tests optionally larger steps may be used and data may be interpolated to make up for missing detail.

Figure 4:
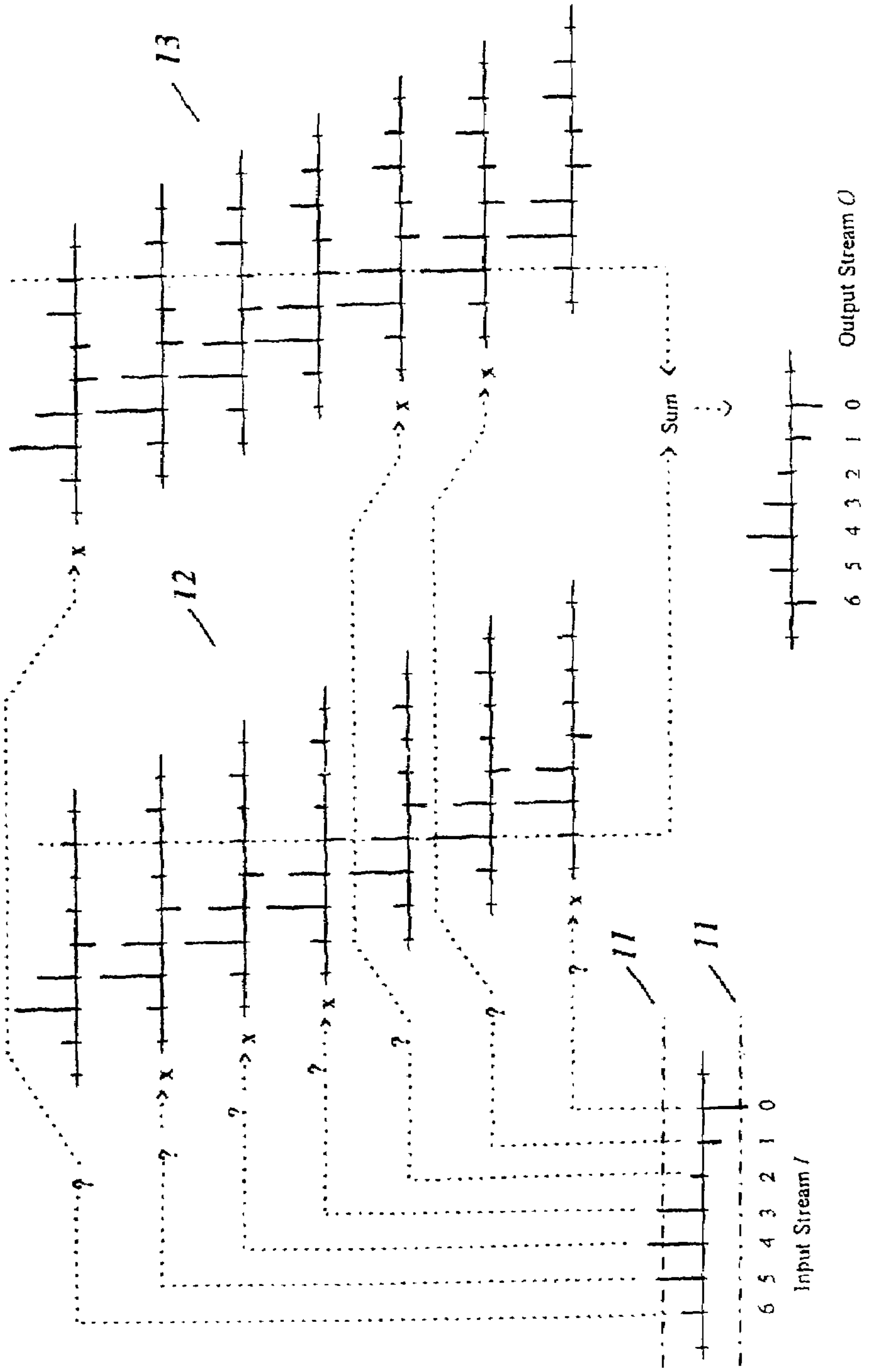
FIG. 4 shows a table of derived figures from a hypothetical 'ideal' compressor and some example figures which may be obtained in reality.

The set of device output levels corresponding to each input levels step is recorded within the memory of the computer and may be represented by the first column of table (a) of FIG. 4.

The above set of tests may be repeated for as many ratio settings as desired, for example for ratios of 5:1 and 20:1, shown in the second and third columns of table (a) of FIG. 4.

The number of different sets of measurements each corresponding to a ratio setting to be taken depend on the degree of accuracy to which it is required to simulate the device under test and also the number of options available on the device. Simple devices may only have one or two slope options in which case these provide sufficient data for storing the characteristics of this device. The later description of the use of this data shows how available data is interpolated to provide options sometimes beyond what was available with the device under test.

FIG. 4 (*a*) shows an example table of data derived from the device under test with some entries omitted for clarity. In fact these figures would be derived from a device with a 'perfect' gain characteristic as can be seen from the plot of these figures in FIG. 5 (*a*) which shows that there is no 'soft knee' as would be encountered in reality. Such a device may not sound ideal but serves to illustrate the process more clearly. It should also be clear that the ratio setting of the device means the change in output level divided by change in input level expressed in dB provided that the signal is well above the threshold.

(ratio=(delta dB in)/(delta dB out)).

If the ratio settings are not specified on the device under test the analyser may assess the curve by inspection of the data at the higher levels applied and assign a value to the ratio based on the above formula. It is also possible to store the actual text used to describe the ratios on the device under test (provided the operator enters this data) and provide these options during simulation rather than the derived figures as an optional closer match to the user interface of the device under test.

These figures also show an exact setting of threshold at −20 dBm at the input to the device. In practice if this varies with ratio settings the figures will not be so clear to interpret but the following processing still applies and the variations in the device will remain embedded within the data for simulation. If a calibrated threshold setting is provided but −20 dB is not available, it is acceptable to use another convenient threshold setting and ideally the analyser will be arranged to allow this value to stored along with the analysis data. This threshold figure may then be used during simulation along with the operator's desired threshold to achieve an accurate simulation by adjustment of the values as described below.

FIG. 4 (*b*) shows some more typical data which may be obtained from a real device and this serves to illustrate the next stage of processing.

Although figures are obtained for an input range of 40 dB these figures are extrapolated by determining the actual slope at the upper end of the graph by averaging over the 3 or 4 highest measurements and using this slope to generate a notional straight line extrapolation at any further higher input level. At the lower end of the graph a slope of unity is assumed and this is used to extrapolate down to arbitrary low levels of input.

Simulation of the Gain Characteristic

During simulation of the gain characteristic of the device which was under test, the operator must first select a desired ratio R of compression to be applied to the signal to be processed by the simulation.

Figure 5:
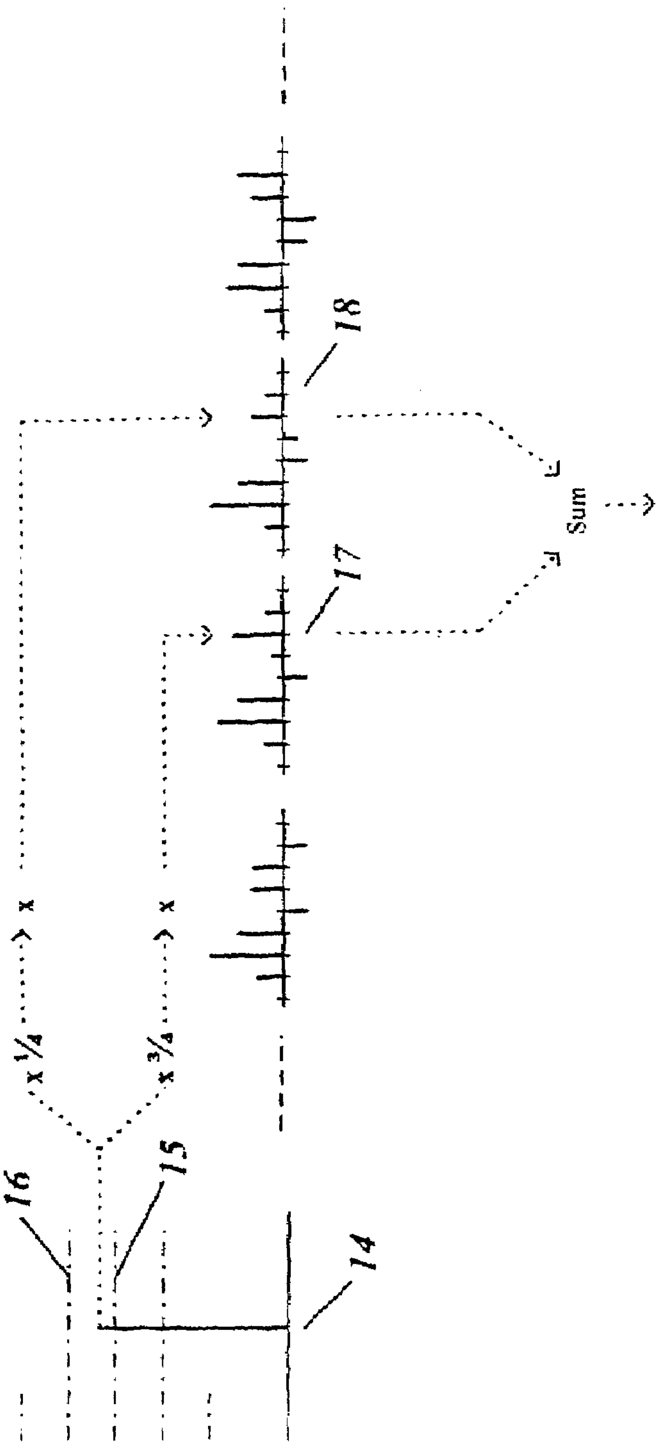
Figure 6:
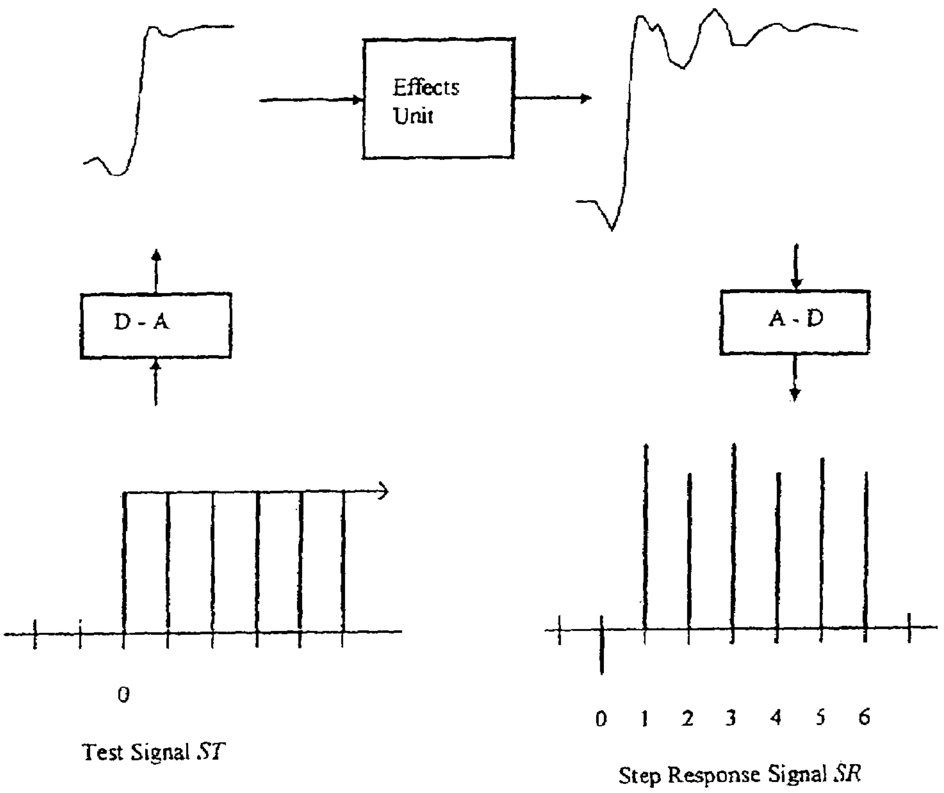

As the input signal is processed the amplitude is continually assessed according to details to be described. The input level is thus determined to be say 1 dB and this is indicated in FIG. 5(*b*).

If the value R matches the ratio of one of the stored curves, say 5:1, the desired output level may be immediately assessed by inspection of the data, and if the value I falls between two stored input values (say I1 and I2 in the diagram) a simple linear interpolation may be used to determine the desired output P. From the known input and desired output an attenuation G (which may be negative. i.e. an attenuation) may be simply calculated as $$G=P-I,$$

and applied to the input signal as described below.

If the value R does not match the ratio of one of the stored curves but there is data for ratios greater and less than the value R then the desired output level can be determined by interpolation between the two stored ratios as follows with reference to FIG. 6.

Figure 6:
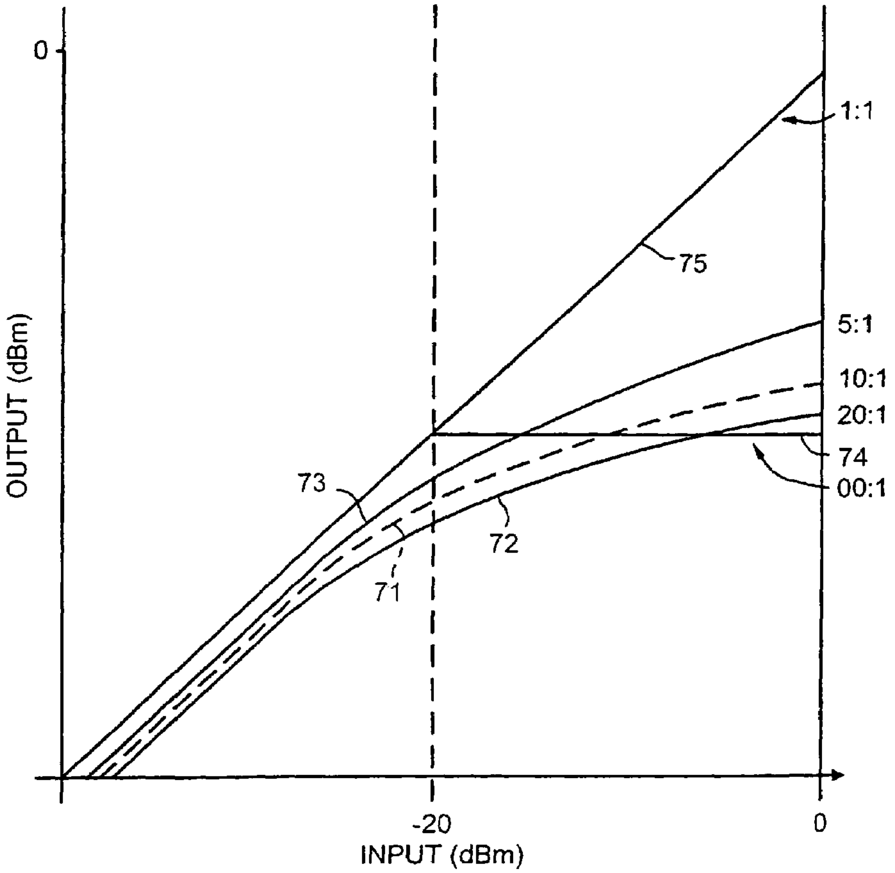
FIG. 6 illustrates the derivation of intermediate ratio curves from measured curves.

FIG. 6 shows a graphical representation of typical stored data where the curve for 5:1 is known (curve 73) and also that for 20:1 (curve 72). It is desired to interpolate curve 71 representing a ratio of 10:1 from this data. Also shown are ideal curves 1:1 (straight line 75) and infinity:1 (curve 74 which has a sharp knee where it meets curve 75 and progresses down at unity gain ratio along line 75).

The curves shown incorporate various approximations inherent in the device originally tested to produce this data including errors in ratio, differences in threshold and small offsets in gain at low level as would be expected from real devices. The interpolation described reflects these imperfections and provides a smooth transition from one curve to another under user control. Any interpolation towards one of the ideal curves will again produce a smooth transition from the measured curve to the ideal curve.

The following describes in detail the interpolation steps.

If curves are known for the higher ratio of M:1 and the lower ratio of N:1, and we desire to know the required output level at a given input level with a ratio of R:1, first determine the coefficient of linear interpolation a from the formula $$a=N(M-R)/(R(M-N)). \tag{1}$$

Then if the output level at the higher ratio M:1 would be X dBm, and the output level at the lower ratio would be Y dBm determined from the relevant curves (using linear interpolation if necessary as described above), the output level Z we require for ratio R is $$Z=(1-a)X+aY. \tag{2}$$

Therefore, first considering the example based on ideal curves where M=20 and N=5 are known curves (72 and 73) and it is desired to determine the output for a curve of R=10 (curve 71), substituting in equation 1, a is determined to be as follows:

$$a=N(M-R)/(R(M-N))=5\ (20-10)/(10(20-5))=5\times10/(10\times15)=1/3.$$

Referring again to FIG. 6 the dotted curve 71 representing a ratio of 10:1 may thus be derived by using the a=⅓ at any input level to perform a linear interpolation between the two curves 72 and 73 according to formula (2) where X is the output level from curve 72 and Y is the output level from curve 73.

Note that although this interpolated curve may not be identical to a measured curve for this ratio from a device under test, the interpolated value satisfies the two criteria that (i) it does represent a reasonable derivation of the unmeasured value and as R is varied between the ratios of the two curves the interpolated curve-smoothly transforms from one of the extreme curves to the other, and (ii) in the case of idealised curves the method produces an exact solution.

If the value R does not lie between two stored ratios one approach is to deny the setting to the user, offering the nearest alternative stored ratio as it was not possible to determine what the device under test would have provided for ratio R. Alternatively a desired ratio may be derived by interpolation using the above method between the nearest known ratio and (for a larger ratio) the ideal curve for an infinite ratio, as shown at 74 in FIG. 6, and (for a smaller ratio) a unity gain curve representing a 1:1 ratio, as shown at 75 in FIG. 6. In the case of interpolating to an infinite ratio, the formula (1) needs to adjusted as follows:

$$a=N/R. \tag{3}$$

Thus a is unity if R is chosen to equal N as expected and a falls to zero as R tends towards infinity.

Where interpolation is towards a 1:1 ratio, equation 1 also simplifies with N=1 to $$a=(M-R)/(R(M-1)). \tag{4}$$

Thus when R is equal to M, a is zero, so the curve tends to that of M, and when R is 1, a is 1, thus the curve becomes exactly the 1:1 curve and no compression effect results.

The interpolation formulae (2) may also be applied directly to gains derived from each ratio rather than absolute output level for any given input level as the formula is independent of any constant added to each term, X, Y and Z.

Determination of Time Dependent Characteristics

In order to determine the time constant characteristic of the device under test it must be analysed for dynamic response. It is possible to take a number of test results from the device at different ratio settings if it is desired to simulate the device at greatest accuracy but generally the same time constants apply at all ratios and s it is possible to make the measurements at one fairly high ratio, for example 20:1.

The device under test should thus be set to a 20:1 ratio with a threshold of −20 dBm or as close to this as possible and the signal generator 2 of FIG. 1 is set to produce a 0 dBm tone at typically 1 kHz. The output or make-up gain should be adjusted for a −20 dB output from the device under test or as close as practical so that overshoots during test do not cause distortion.

Figure 8:
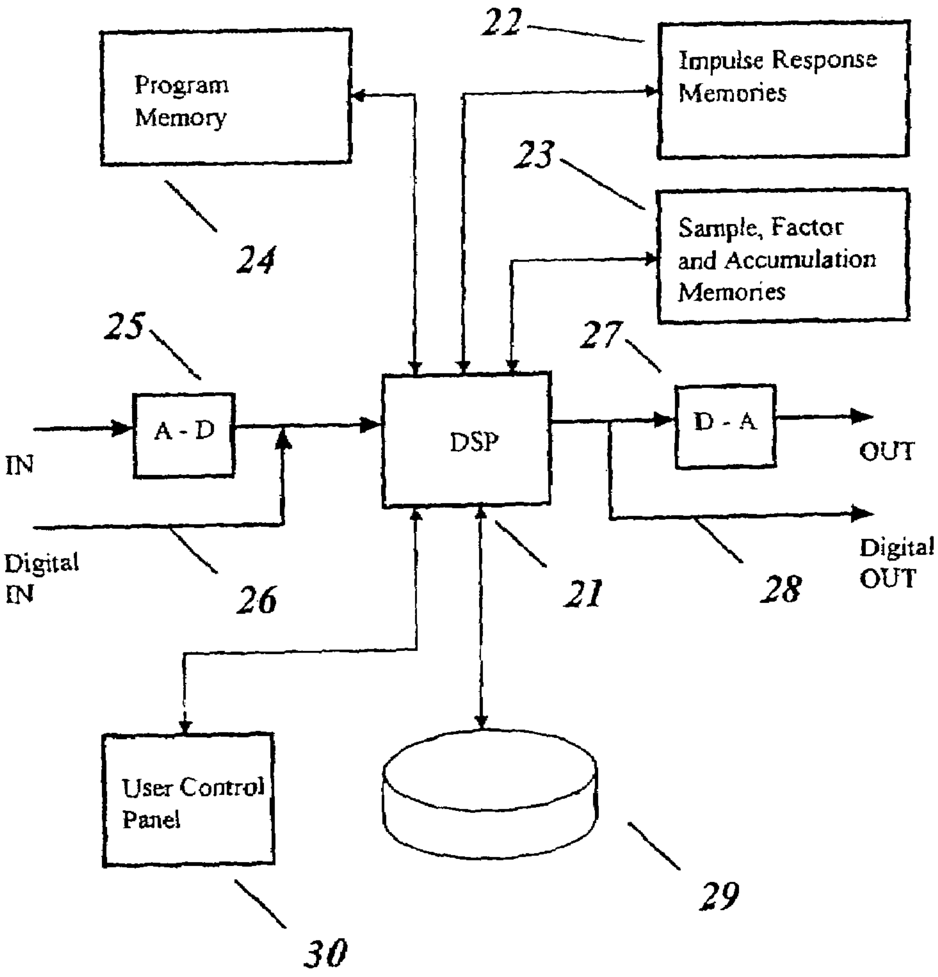
FIG. 8 shows a flow diagram for assessing the time constant characteristic of a D.U.T.
Figure 9:
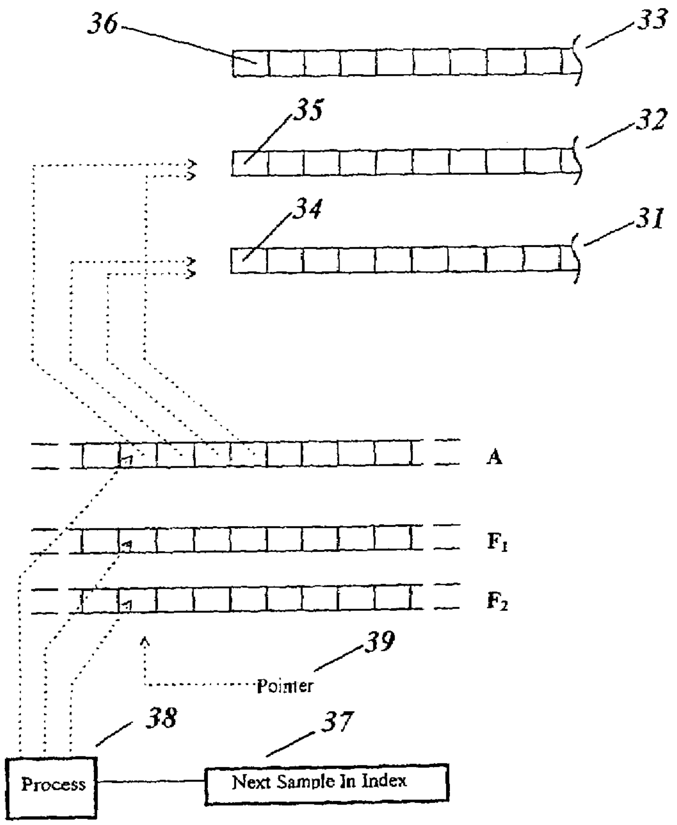
Figure 10:
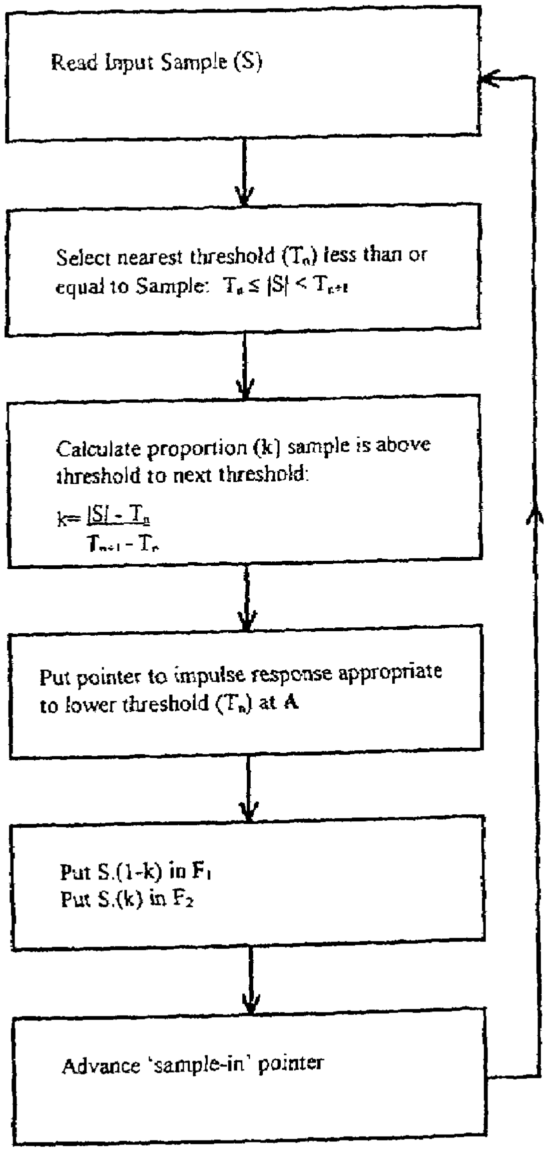
Figure 11:
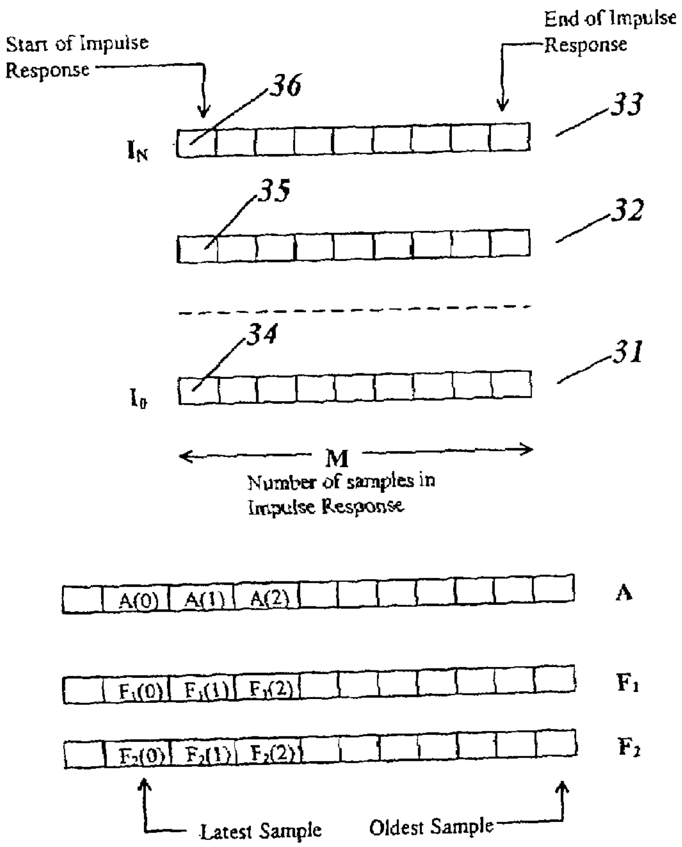
Figure 12:
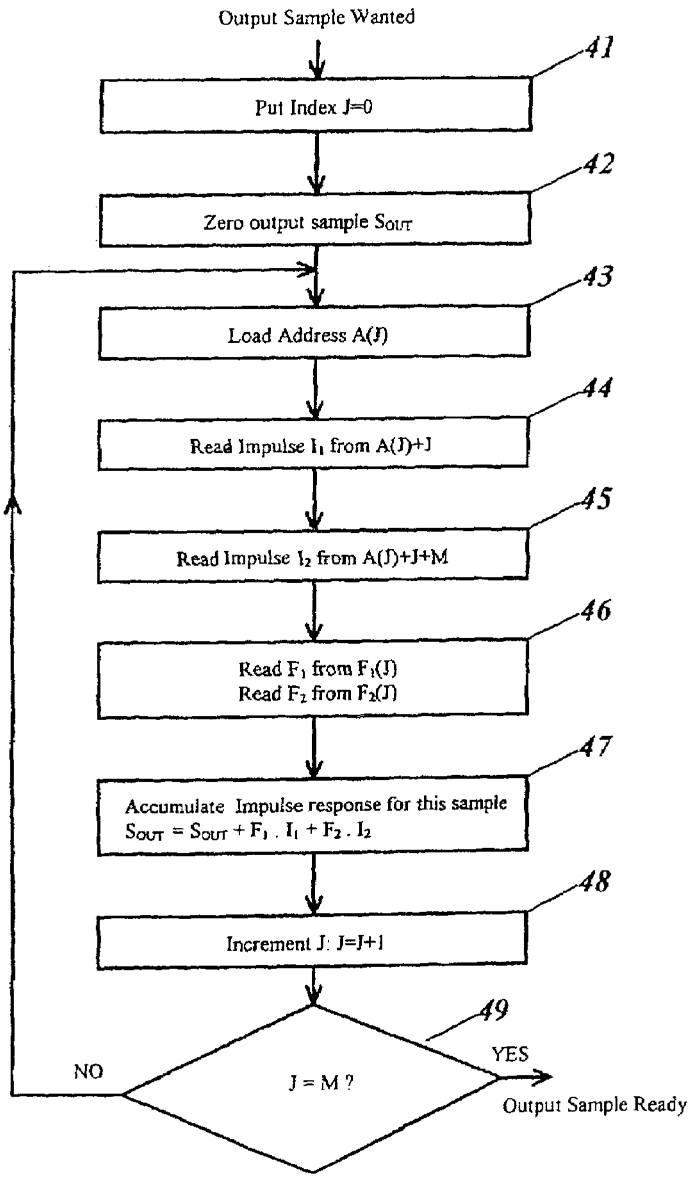
Figure 13:
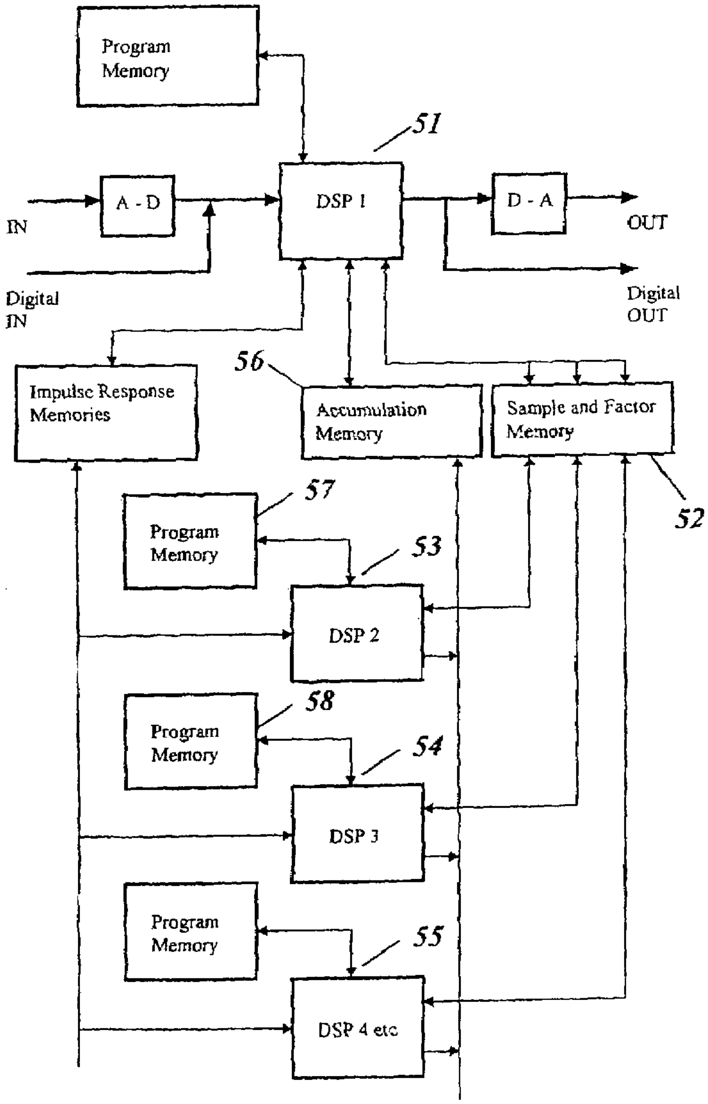

The controls are first set to the fastest attack and release times available on the device under test, and then the analysis process is started and proceeds automatically as indicated in FIG. 8.

It is assumed that the output of the test generator is already at 0 dBm into the device under test. The test output is first reduced to −20 dBm (step 80) and the output from the device is repeatedly assessed (step 81) in the level detector 3 of FIG. 1 until the level has stabilised to a variation of less than 0.1 dB over the period of typically 1 second. The variation in output level from the device is stored repeatedly during this process to determine the dynamic characteristic of the recovery time constant of the device.

The generator output is now increased again to 0 dBm (step 82) and again the output of the device is repeatedly assessed and stored (step 83) until the output is again stable to within 0.1 dB per second.

A number of ways of determining level during a rapidly changing signal are possible but since the signal generator and level detector are under full control of the system controller one method with fast response is to arrange that the frequency of the test tone is synchronous with the sampling rate of the generator/detector combination. Since the measured waveform is now synchronous with the sampling rate, the level calculation needs only be performed for one cycle period, repeatedly until stable.

From these measurements the time constant characteristic for the fast setting of the device under test can determined and stored. All the gain values for this derivation are considered as multiplicative factors, not as logarithm gain changes. The time constant is defined as follows: During a change in gain from G1 to G2 it is the time taken for the gain to reach G3, where (G3−G2)/(G1−G2)=1/e, where e is the exponential constant. Since the initial and final gain is known the period to reach this gain may be calculated from measured characteristic. This derivation applies when the input signal is increased suddenly in level. When the input signal is reduced suddenly, the gain recovery is usually exponential towards the gain setting applicable for zero input signal, so G2 should be taken as this limiting gain and if the gain does not lie between G1 and G2 under these conditions the time constant should be derived from a smaller change in gain according to the assumption that the gain follows a similar exponential curve.

It is also possible that a multi-stage time constant circuit is included, and inspection of the amplitude change characteristic can determine this for use in simulation.

Many existing devices offer a limited set of attack and recovery time constants, often labelled as fast/medium/slow and thus the measurements above should be repeated for each of these settings. In simulation the operator can be offered these simple choices which can recall the stored time constants when selected. In addition the user can be offered a continuously variable time constant to extend the simulation beyond that achievable with the original device under test, and where all three speed options are not available preset defaults can be supplied.

Determination of Distortion Characteristic at One or Multiple Attenuation Levels.

The final characteristic of the device to materially affect the audible performance is the non-linearity of the gain control element. Due to the analogue nature of many such gain elements significant non-linearities may be present both due to the device itself and due to the feedback of any audio signal into the gain control signal 16 of FIG. 1. The non-linearity of the device may be assessed in the following manner using and extending the techniques of The Prior Application.

There are three approaches to analysing and simulating the non-linearity of the gain element. One is to determine a single characteristic set of impulse responses according to the method of The Prior Application of the gain control element in the linear portion of the curve of the device under test. This may be performed by setting the threshold control of the device sufficiently high that the test sequence of impulses of the The Prior Application do not at any time cause any gain reduction to take place. In addition if the device has a 1:1 setting this should be used to prevent gain variation. This establishes a fixed analysis of the of the gain control device which may be used in the simulation as a fixed processing characteristic to be applied to an input signal in addition to the gain control adjustment already described.

A further method is to assess two characteristic sets of impulse responses of the gain control at two different attenuations. Since most gain control devices operate in the range of zero gain reduction to 20 dB of gain reduction, it is desirable to take two measurements of the distortion of the gain control device at these two extremes and to linearly interpolate them during simulation using methods of bilinear interpolation as disclosed in The Prior Application and shown in FIG. 13, in which one dimension of interpolation is the instantaneous amplitude of the incoming signal being interpolated between adjacent impulse levels, and the second dimension is interpolation between non-linearities of the two gain characteristics according to the degree of attenuation to be applied.

A third method is to take multiple assessments of the distortion characteristic at multiple gain reductions and to pair-wise interpolate to get the desired characteristic for any given required gain reduction.

In order to take measurements of the gain control element at specific attenuations it is necessary to modify the test signal described in The Prior Application to ensure that each test impulse is applied at a known attenuation of the device under test.

In order to do this the device under test should be set to slow attack and decay characteristics and a large ratio, say 20:1 if available.

Using the techniques already discussed to assess the gain characteristic it is now possible to apply a sine wave tone, typically at 1 kHz, or at a frequency close to this that this synchronous with the sampling rate, that results in a known attenuation. This level is then maintained until the gain of the device under test has stabilised, again using the techniques already described.

Figure 7:
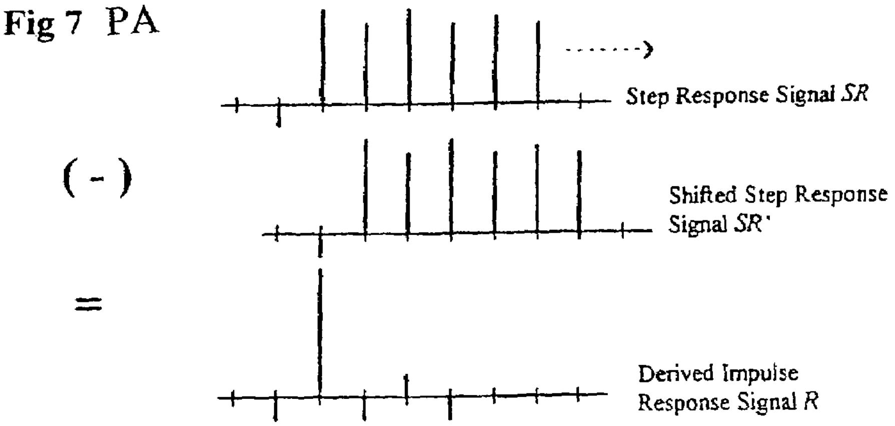
FIG. 7 shows the application of test impulses as required by The Prior Application in conjunction with a gain varying device.

FIG. 7 (*a*) shows the sine wave being applied at 91 to achieve the desired gain. The sine wave is then removed (over short period T1 to minimise the impulsive effect). A period T2 is then allowed to elapse to allow any stored energy to dissipate. FIG. 7(*b*) shows the output of the device under test which is being analysed by both the level detector 32 of FIG. 1 and the impulse storage unit 33. The signal 95 has been measured to indicate a steady state at the desired gain reduction. During period T2 any ripples 96 are ignored.

Step impulse 92 is applied after T2 and held as the response to this impulse 97 is stored. Finally after period T3 the step impulse is removed and the sine wave restored. The recovered wave 99 is then allowed to stabilise before the process is repeated for the next different amplitude impulse.

In this way a complete set of impulses are sequentially applied to the device in a known stable gain state and stored and processed according to the method of The Prior Application. In this way a characterisation of the non-linear response of the gain control element at the know gain reduction is obtained.

The sequence may be applied at a different desired gain to assess the non-linear response of the device at this different gain. In this way it is possible to store either two response sets for the two desired gains at either extreme of the range or if desired a complete set of responses spanning the desired range which may be pair-wise interpolated during simulation.

In experiment it has been determined that gain control elements demonstrate comparatively short impulse responses and so the entire impulse response may be captured before the gain has significantly changed. In practice it is found a settling time T2 of about 100 samples at 48 kHz is sufficient and a storage time T3 of 200 samples is sufficient to encapsulate the performance of the device under test. Thus the test is completed for each impulse in under 10 mS from the discontinuation of the level setting tone 91. Recovery time constants of about 1 S are therefore sufficient to hold the gain sufficiently constant during this period.

It should be noted that if the make-up gain controls are not adjusted during taking a sequence of measurements (as would be expected during automated testing) and as the absolute levels of the impulse response are recorded, the gain reduction as well as the non-linearity characteristic is encapsulated in the stored impulse response.

The simulation process (described in detail below) applies an appropriate impulse response (or set of responses according to the Prior Application) dependent on the gain reduction to be achieved in the simulation. In addition it is capable of applying additional attenuation when simulating desired gain reductions outside the range sampled impulse responses with attenuation inherent in them. An exactly equivalent final result can be achieved in two ways, the choice being dependent on the implementation details of the system, for example, the amount of real time computing power available during the simulation.

Method 1 is to leave the impulse response (or sets of them) as sampled, with their inherent attenuation. In this way as the correct response is automatically selected the correct attenuation will be achieved. Intermediate attenuations can be achieved by an appropriate choice of linear interpolation coefficient. Extrapolated attenuations are achieved in simulation by using additional gain modification by means of a digital multiplier.

Method 2 is to eliminate the inherent attenuation from the sampled impulse responses. This process is known as normalisation. Since the exact attenuation inherent in each impulse-response (or set of them) is known according to the method described above, it is possible to multiply every element of the impulse response (or set of them) by a constant which is the inverse of this attenuation factor. In this way, during the simulation, the impulse response selection and interpolation are used solely to determine the impulse response characteristic appropriate to an attenuation. The chosen impulse response will then not result in any intrinsic attenuation. The appropriate gain reduction is then applied independently in the additional gain reduction element (113 in example simulator to be described). This method allows the audio processor to offer the choice of simulating the gain reduction characteristic (in terms of input level to output level) with or without the simulation of the gain reduction signal quality sampled from the device under test or with a user selectable limitation on the range of impulse responses to be applied.

Simulation of Level Control Device

Figure 9:
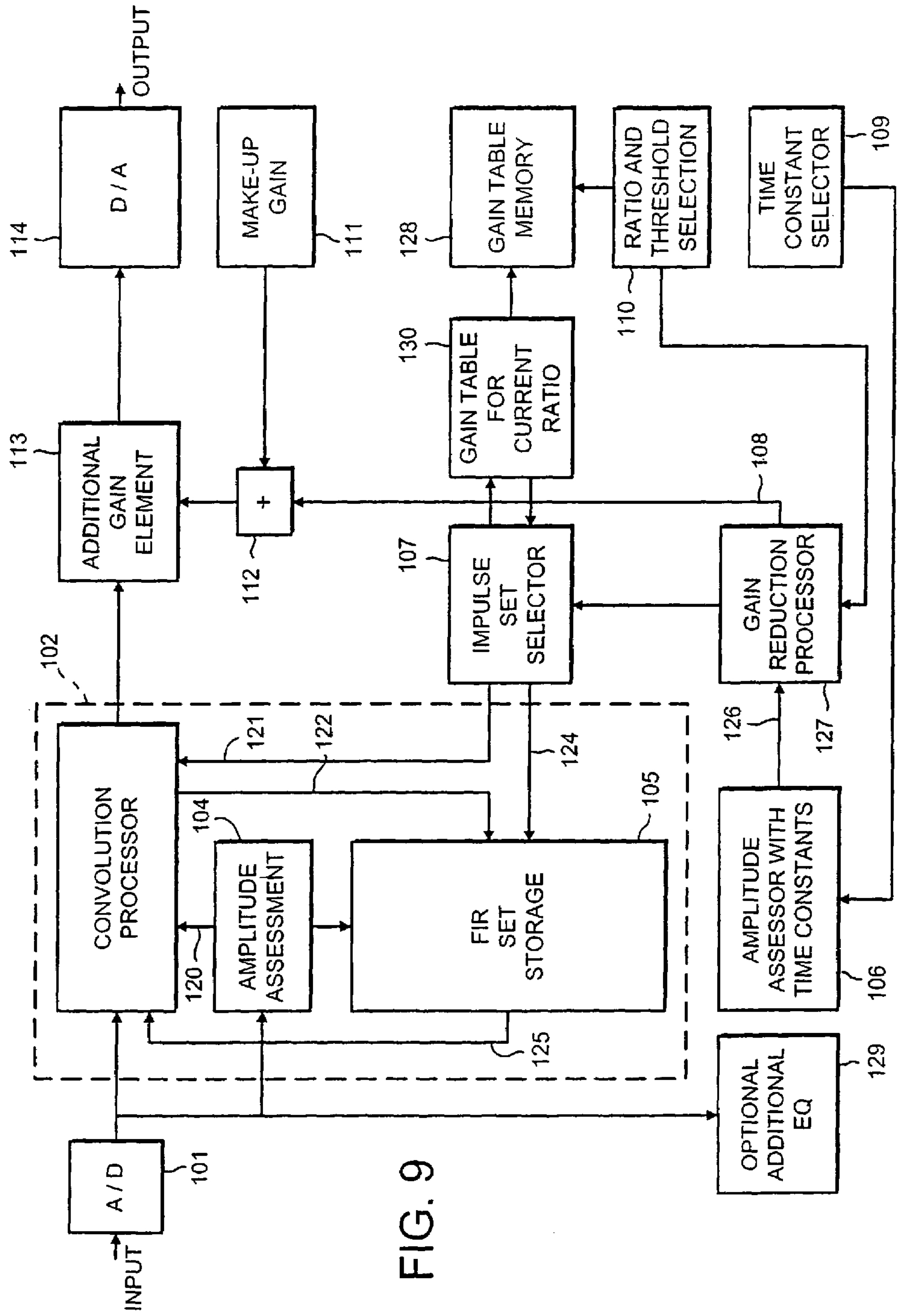
FIG. 9 shows an arrangement for applying the simulation of a gain varying device in conjunction with the simulation of non-linearity described in The Prior Application.

FIG. 9 shows an overall diagram of the simulator of level control devices.

Analogue to digital converter 101, which may be omitted if the input signal is already in digital form, takes an input analogue signal and feeds the signal to the modified convolution processor device 102 as described in The Prior Application comprising the modified convolution device 103 which convolves the incoming signal with the impulse response stored in the Finite Impulse Response Set (FIR set) storage device 105, under control of the amplitude assessment device 104 which selects on a sample by sample basis an appropriate response or pair of responses from FIR set storage 105 and also supplies an interpolation value 120 to processor 103.

The convolution processor 102 may also contain additional inputs 121 and 124 which receive a second interpolation value 121 (if required) and FIR set selector value 124 (if required), this FIR set selector value selecting between FIR sets representing different gain reductions of the original device under test, and the interpolation value 121 providing interpolation values between them.

Address value 122 is used to select the appropriate offset in each FIR appropriate to the convolution operation and the amplitude assessment unit provides up to two FIRs from each set providing two values for interpolation, with set selection 124 selecting two sets of values to use, thus providing 4 data values on input 125 to the convolution processor for each step in the convolution. The two interpolation values 120 and 121 provide for bilinear interpolation between these four values selected on a sample by sample basis of the input signal.

The input signal is further applied to the amplitude assessor with time constants 106 which determines an envelope for the input signal on a sample by sample basis under control of the user selected time constants 109. The resulting envelope 126 is fed to gain reduction calculation device 127.

Adjustment is first made according to any user desired change in the threshold setting. If the original measurements were taken with an assumed threshold of −20 dB, and the user now select a threshold of −10 dB, the difference (10 dB) is subtracted from the input level derived in order to determine the gain variation required to simulate by reference to the derived gain characteristic data. In general if the original measurements of the gain characteristic were taken at a threshold of −A dB and the user now desires a threshold of −B dB the amount (A−B) dB is subtracted from the derived input signal envelope.

Gain table data according to FIGS. 4 and 5 is stored in Gain Table Memory 128 and whenever the user selects a new ratio a table appropriate to the desired ratio is calculated according to the description above in reference to FIG. 6 and stored in memory 130.

The envelope of the input signal, modified by a user change in desired threshold, is fed to memory 130 to determine the desired output level for the signal of this envelope, and accordingly to select a desired gain for the signal at this instant.

The desired gain is fed to impulse set selector 107 which selects the desired FIR or set of them according to the method to be described below (under the heading "Gain Reduction Processor") and derives signal 124 which is fed to the impulse response memory addressing, and (in the case where a pair of impulse responses or sets of them is used) a linear interpolation value signal 121 which is fed to the convolution processor.

Where the gain required is embodied within the FIR (or set of them), no additional gain adjustment is required (except for any user specified makeup gain described below). Where the gain required is not embodied in the FIR (or set of them) a gain adjustment signal 108 is derived and fed to the additional gain control element 113 via gain combiner 112.

User required make-up or overall gain may be applied by user selection 111 providing an extra gain demand signal which is combined in combiner 112 (which may be an adder if the gain signals are in logarithmic form, for example specified in dB, or a multiplier if specified in the form of a multiplicative value). The resultant gain signal is fed to the additional gain element 113 which applies this gain to the output of the convolution device and feeds the resultant signal (by way of digital to analogue converter 114 if desired) to the output of the device.

Amplitude Assessment with Time Constants

Figure 10:
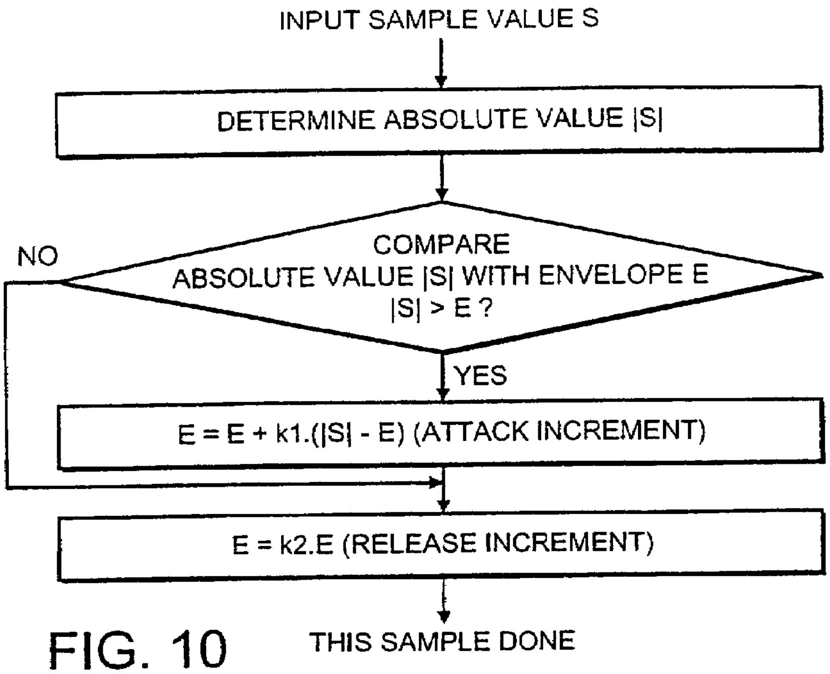
FIG. 10 shows a flow diagram of the implementation of the time constant characteristics of a device during simulation.

Amplitude assessment may be performed in a number of ways familiar to a skilled person. An example is shown in FIG. 10. The absolute value of an input sample S is determined and is known as |S|. This is compared with the current envelope E. If it is greater, the value is E is increased according to the amount |S| exceeds E under control of the attack constant k1, as follows $$E=E+k1.(|S|-E).$$

The release constant is then applied which results in an exponential reduction in E:

$$E=k2.E.$$

It is possible to elaborate this with two stages of time constant or with additional low pass filtering to remove unwanted audio modulation of the derived envelope with improvements in overall distortion characteristics but the above is sufficient for an acceptable simulation.

The constants k1 and k2 may be related to analogue time constants T1 and T2 by noting that 1−k1 raised to the value r gives exp(−1/T1) and k2 raised to the value r gives exp(−1/T2) where r is the sample rate in samples per second.

Gain Reduction Processor

By reference to the gain characteristic of the device under test an appropriate gain table is derived for the ratio desired by the operator according to the method already described. This may be calculated once each time the user selects a desired ratio setting.

On a sample by sample basis the envelope signal derived from the amplitude assessment of the input signal is determined and converted to logarithmic form (i.e in dB relative to 0 dBm input). If at this stage it is desired to adjust the threshold from that used during the sample, an increase in desired threshold is subtracted from the envelope (a decrease is added) and the result used to determine a desired gain from the table of output amplitudes versus input amplitudes. If the value falls between table entries a simple linear interpolation is applied.

Once the gain required is determined, it is now necessary to determine whether there is a FIR set stored appropriate to this gain value. If there is then this FIR set is selected into the convolution selection algorithm. If there is not a FIR set for this gain reduction, but there is for two other gain reductions on either side of the required gain, these two FIR sets are selected into the convolution algorithm and an interpolation value is generated to achieve the desired intermediate effect. In the case where the attenuations are embodied in the FIR (or sets of them) the interpolation factor may be derived as follows.

If FIR set A gives an attenuation of a dB and FIR set B gives an attenuation of b dB, then the multiplicative factor appropriate to each Ma and Mb is as follows $$Ma=10^{(a/20)}, \text{ and } Mb=10^{(b/20)}.$$

Applying an interpolation factor of j to FIR set A gives a total multiplicative gain Mg of $$Mg=j.Ma+(1-j).Mb.$$

And the desired gain in dB G=20 log(Mg), or $Mg=10^{(G/20)}$.

Thus j may be derived for this sample from the rearrangement $$j=(Mg-Mb)/(Ma-Mb). \quad (5)$$

Ma and Mb are known in advance for each FIR set so it is only necessary to calculate Mg and hence j for each sample. In addition a list may be kept at for example 0.1 dB intervals of all desired gains and the resulting choices of FIR sets and interpolating factors so that simple table look up may be performed on a sample by sample basis.

In the situation where the desired gain is greater than or less than that for every stored FIR set. The single FIR set embodying a gain closest to the desired gain is selected into the convolution algorithm and an additional gain factor F is generated such that $$F=G-A,$$

where G is the desired gain at this instant and A is the gain of the nearest FIR set. The additional gain F in dB is added to any make up gain in 112 and passed to the additional gain element 113 to generate the desired overall gain.

In the case where the FIRs (or sets of them) do not have attenuations embodied in them, i.e., they are normalised to a fixed gain, the interpolation factor can be derived as described above to generate the desired audible signal processing characteristic although the convolution processor does not provide any gain adjustment to the signal. In this case the entire gain adjustment value G is fed to combiner 112 to implement the gain adjustment characteristic of the simulation. It should be noted that this allows the interpolation factor j to be derived in other ways, such as simple linear interpolation of the desired gain expressed in dBs between the gain values in dBs appropriate to the pair of FIR sets. Both the method described and this linear interpolation provide acceptable results and the choice will be open to the system designer according to available processing power.

EO in the Side Chain

Where the system is used for sampling a complete audio processing channel including a gain control element, there may be some equalisation applied between the input and the gain controlling device. This results in some input signals being dynamically adjusted differently from others depending on frequency spectrum. A similar effect is achieved if a gain controlling device provides EQ in the side-chain (i.e. between the main audio signal path and the level detection section of the gain controlling device 1 of FIG. 1.

Both these variations can be handled by taking an additional analysis of the signal path between its input and the gain controlling device by taking a single impulse response test of this path to determine the frequency characteristic. This characteristic may be replicated in the optional additional EQ unit 129 of FIG. 9.

This additional equalisation is not usually critical to the operation of the overall system and it may be implemented by a straight finite impulse response convolution with the data derived from the above test or may be simulated by a derived infinite impulse response equaliser of broadly similar frequency response.

The existence of equalisation prior to the gain control element or in the side chain may suggest alternative frequencies for use in the gain reduction analysis such that the test signal is passed properly into the gain determining elements. It is also possible to use a number of different test frequencies to analyse the behaviour of the signal path prior to the compressor without reconnecting the test arrangement of FIG. 1 for subsequent synthesis.

Use Without the Non-Linear Effects Synthesis of the Prior Application

Although this system has been described using the non-linear effects analysis and synthesis of The Prior Application it is possible to determine a single impulse response at each gain setting measured to determine frequency response and relative gain and apply the above technique without the non-linear section of the algorithm. In this way a restricted but useful synthesis of the device is achieved simulating the gain characteristic, the frequency response and variation with gain reduction (if multiple gain reductions are sampled) and also simulations of time constant if implemented. This may even be desirable if it is determined that the non-linearity of the original device is not desirable in a given simulation so in any event the degree of non-linearity should be made variable as described in The Prior Application and also to include using a single impulse response from a derived set of data.

It is also possible to omit the impulse response determination completely and to use the methods of the invention to simulate the gain characteristic alone or in combination with the time constant characteristic. In such a system, the table of input levels to output levels as for example shown in FIG. 4 is derived from a gain controlling device and stored for future simulation. It is then possible to simulate the gain reduction characteristic without the convolution achieving at least that part of the desirable characteristic of the original device embodied in this transfer curve. Such a simulation system, with reference to FIG. 9, would omit the convolution processor 102 and the selector circuitry 107.

Use without Analyser or with Data Derived from Alternate Uses of the Analyser

Although the description explains how to take measurements of existing audio dynamics processor devices and how to simulate them, it is also possible to generate the necessary data for synthesis by means of any desired model of such a processor or by mixing data obtained from different sources.

In particular:

1. The curves of gain characteristic can be calculated for a computer model of a desired effects device, or may be drawn by an operator on a computer screen either completely freely, or may be modified manually by graphical manipulation from existing data. In any of these ways an operator may obtain a desired gain characteristic not available in a real dynamics processor device.

2. Time constant characteristics may be freely substituted for any measured characteristics, or derived by operator choice to more closely suit the audio material to be processed.

3. Characteristic FIR sets (either linear or non-linear) may be generated by computer model of a gain control device that it is required to simulate, for example there are now a number of ways to simulate valve circuits, and it would be possible to generate arithmetically the impulse response of these simulations appropriate to a variety of levels of impulse and gain variations of the simulated device. These impulse responses may then be used with the methods described herein to process audio according to these derived characteristics.

4. Characteristic FIR sets (either linear or non-linear) may also be derived from other audio devices or systems which have a desirable characteristic and used with the methods described herein to simulate a dynamic control device not currently achievable.

One example is illustrated by reference to FIG. 11 in which it is shown how to derive two or more sets of impulse response characteristics from a microphone positioned in front of a loudspeaker 142 in a room 143 of a particular ambience. Responses (either linear using a single impulse test or non-linear as described in The Prior Application) can be obtained with the microphone at location 140 and at a different location 141 at a different distance from the loudspeaker, giving an amplitude reduction characteristic derived from moving away from the sound source. The two impulse responses or sets of them embody two different gains (as well as different ambience characteristics) and this pair of impulse response characteristics is now used in the method of simulation described herein to simulate compression and the compression effect simulated will be one of reducing dynamics by moving towards and away from the audio source according to amplitude of the source. This may be used for example to simulate the effect of a singer who has learned to moved to and from a microphone according to the volume of the voice to control dynamics.

Figure 12:
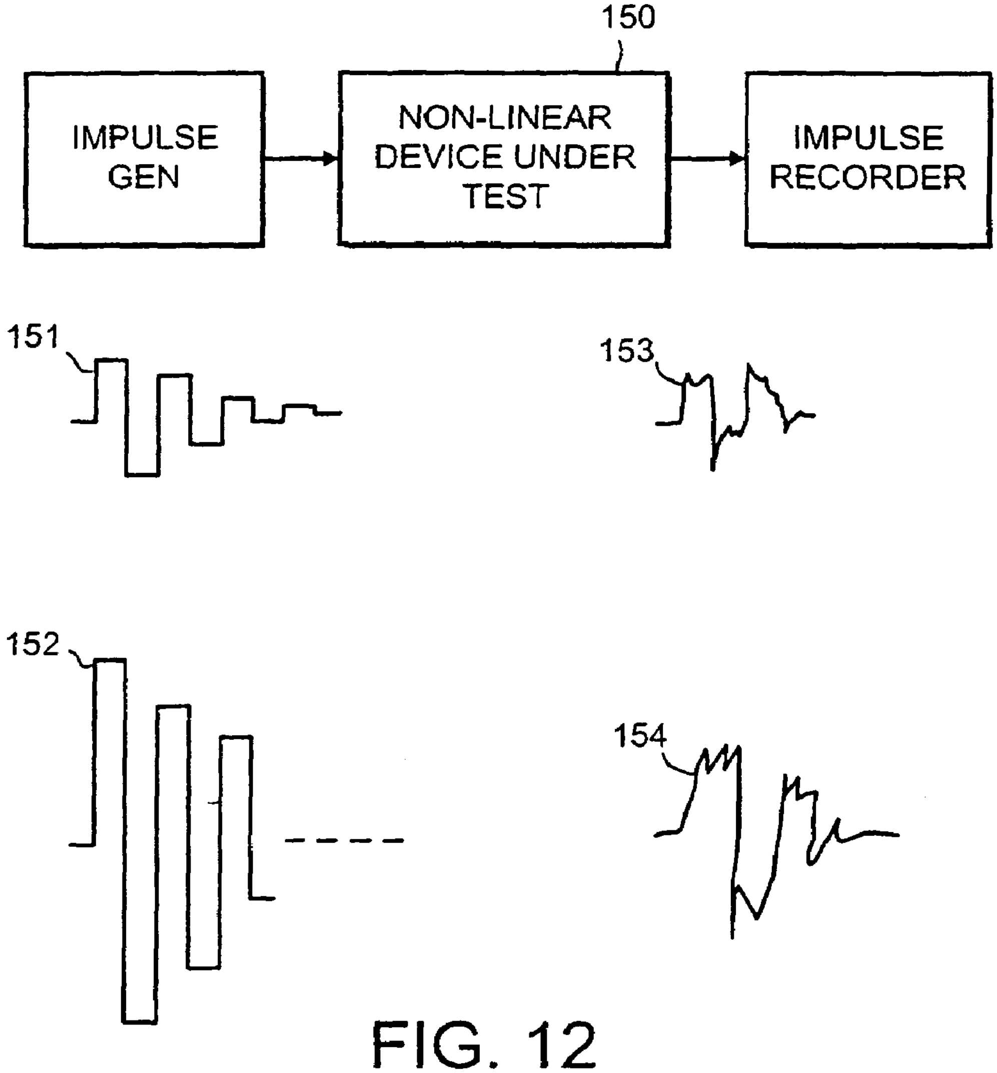
FIG. 12 shows another example of an alternative way of collecting sets of impulse response data to further simulate compression effects.

A further example is illustrated in FIG. 12 in which a set of non linear impulse responses of a system 150 (which may also be stereo or other multi-channel system) is taken at progressively increasing levels comprising at least two different sets of levels 151 and 152 according to The Prior Application to generate response sets 153 and 154 where the system 150 exhibits gain reduction through progressively moving into non-linearity. Each FIR set is assigned a gain value for use in the gain reduction simulation according to an estimate of the gain of the system at the peak signal level, typically by estimating the peak deviation of the impulse response obtained from each sequence of test impulses. These are used as a set of non linear FIR sets of at least two intrinsic gains in the simulation method described herein to produce a compression effect characteristic of an overdriven system. System 150 may be a totally electronic device or for example an amplifier and speaker system with sound picked up by microphone.

Figure 13:
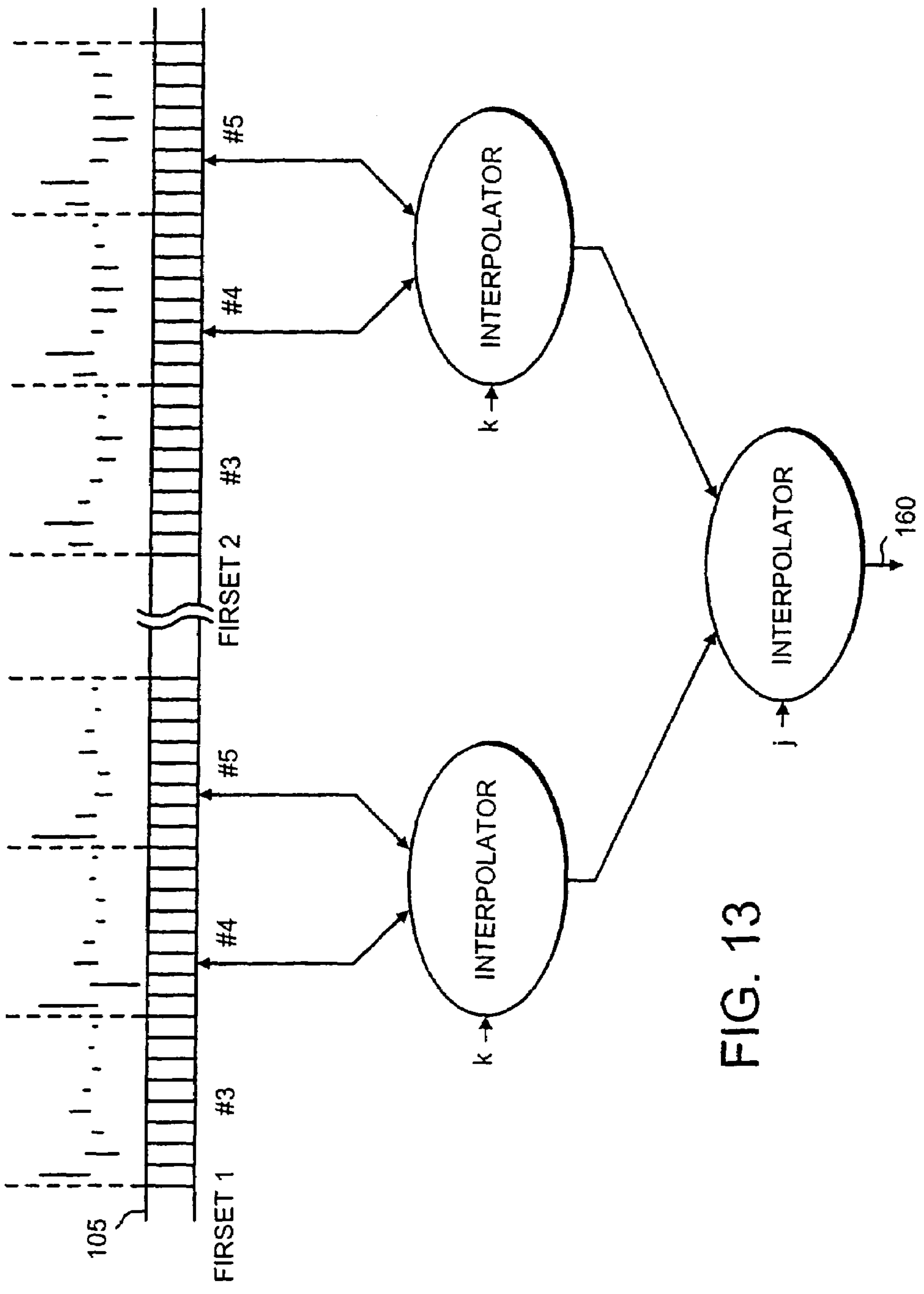
FIG. 13 shows in more detail the bi-linear interpolation method.
Figure 1:
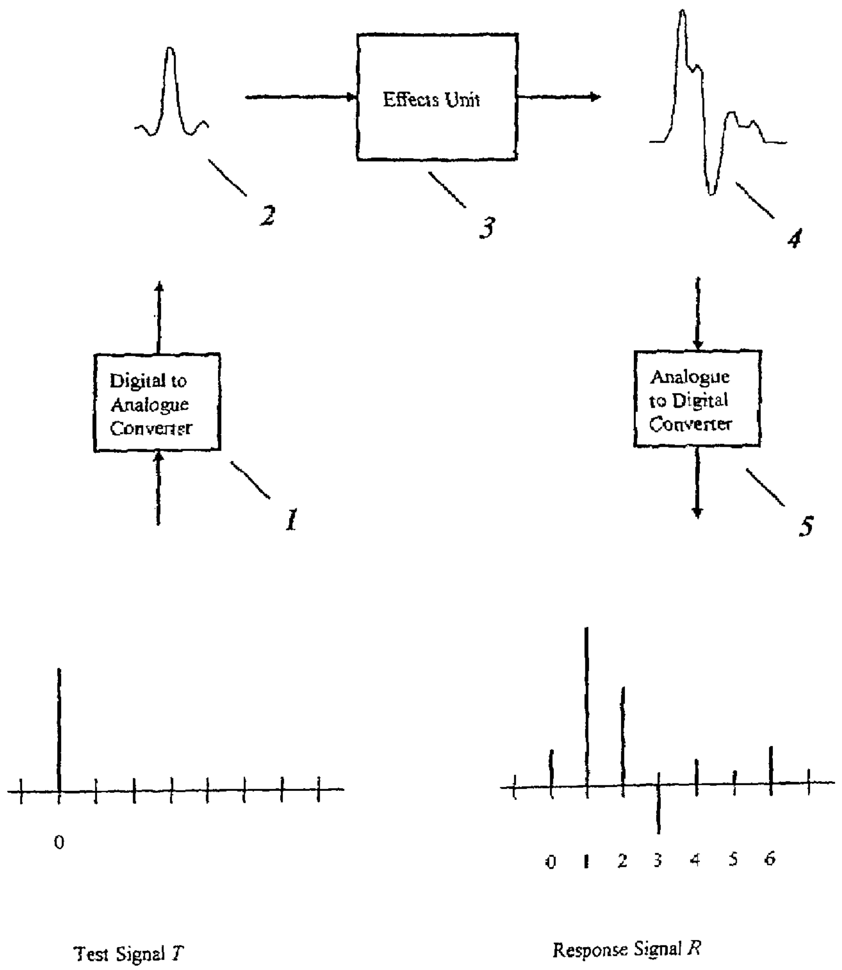

By reference to FIG. 13 the exact operation of the bi-linear interpolation of FIG. 9 can be demonstrated.

FIR set storage 105 of FIG. 9 is also illustrated in FIG. 13 as a sequence of storage of sets of impulse responses. In this case each impulse response is shown with 8 elements for clarity but in practice many more elements will be used.

According to The Prior Application a factor k is determined to interpolate between two impulse responses in a FIR set (see for example FIG. 10 of The Prior Application). This is shown appearing in FIG. 13 where it is used to interpolate between elements of for example response #4 and #5 of FIRSET 1, and also between the matching elements of FIRSET 2. It is also shown in FIG. 9 at 120.

Interpolation factor j is also determined in equation (5) above as the interpolation between two sets of impulse responses representing two different gains. These are illustrated in FIG. 13 as FIRSET 1 and FIRSET 2.

In this way a single value 160 is derived from the 4 elements of the 4 impulse responses by bilinear interpolation using values j and k which are determined on a sample by sample basis for each step in the convolution process as the elements of each impulse response are stepped through in the convolution algorithm.

Figure 14:
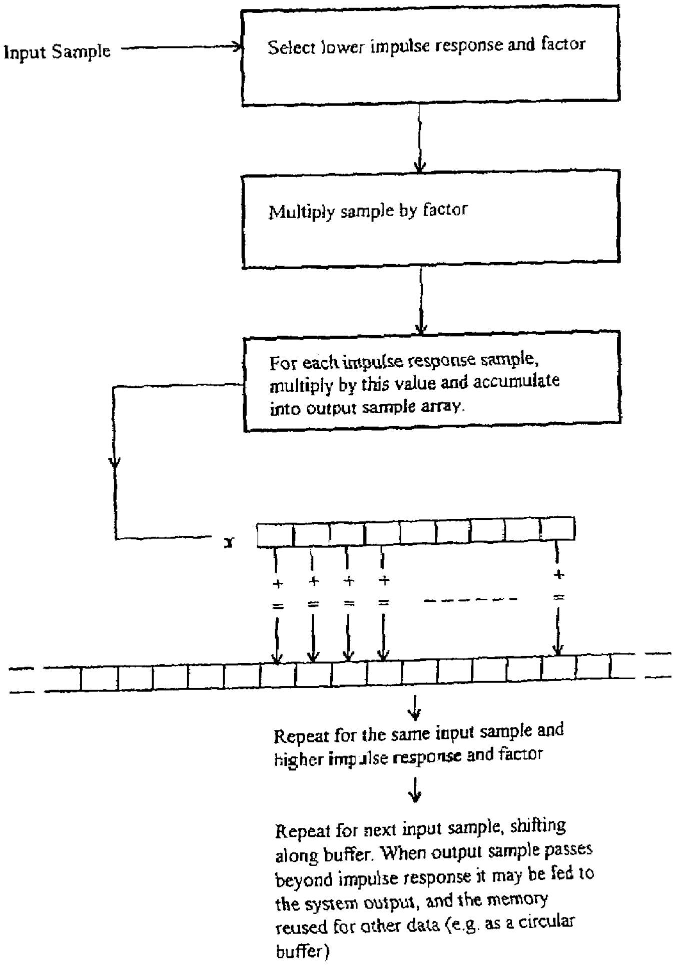

In practice, as described and shown in FIG. 14 of The Prior Application, it is convenient to generate part sums for each multiply accumulate operation for a given input sample, where j, k and the pointers into the FIR set memory can be determined once for each sample and applied repeatedly. In this way for each input sample an output sample can be produced and part sums for subsequent output samples assembled.

While this invention has been shown and described above with reference to preferred embodiments, the foregoing and other changes in form and detail may be made therein by one skilled in the art while still remaining within the spirit and scope of the invention which is to be defined only by the appended claims.

PRIOR APPLICATION

The material which follows, ending immediately prior to the claims herein, is copied from the Prior Application. It should be appreciated that Figure numbers and reference numerals have not been changed in the text and that all such Figure numbers and reference numerals recited below are limited to this section. However, in the drawings, the figure numbers for this section have been edited to include the suffix “PA”. Thus, FIG. 1 of the Prior Application is FIG. 1PA, etc. The Prior Application, exclusive of claims and abstract, now follows:

Audio Effects Synthesizer with or without Analyser

Introduction

In audio recording for music or film it is often desired to pass an audio signal through an effect unit to alter the sound in a desirable way, for example, in film work a recording may be made to sound as if it were coming through a telephone from a distance or in a room with characteristic sound quality even though the original sound was recorded in a dead acoustic of a studio. In music work more severe distortions may be required, for example passing the signal through a guitar amplifier and speaker which is allowed to distort and back into a microphone, or through an analogue recording cycle onto and back from magnetic tape which is often considered to add a desirable sound quality.

Many devices exist to process signals in these ways, some specific to individual effects and some programmable to generate a range of effects on demand. The purpose of this invention is to allow the simulation of a large variety of such effects and further to allow existing effects to be analysed and the characteristics of the effect to be stored and simulated on demand.

LIST OF FIGURES

The invention is described by means of reference to the attached figures which are described in detail after the following summary explanation.

FIG. 1 shows the process of analysing an existing effect unit by means of applying an impulse and recording its impulse response.

FIG. 2 shows the application of an input sound stream to generate a processed output stream by convolution with the sampled impulse response.

FIG. 3 shows the application of impulses of different magnitudes to an effect unit to obtain more than one impulse response appropriate to different impulse amplitudes.

FIG. 4 shows the application of an input stream to generate a processed output stream by modifying the convolution so that a different impulse response may be applied to different input samples—in this case depending on amplitude of the input sample compared with a threshold shown chain-dotted.

FIG. 5 shows a further refinement where an input sample between two thresholds is applied proportionately to the two impulse responses appropriate to the thresholds on either side of the input sample.

FIG. 6 shows an alternative step pulse that may be applied in the analysis process.

FIG. 7 shows the derivation of the impulse response from the step response by means of a sample shift and a subtraction.

FIG. 8 shows an arrangement of DSP and memory which can implement the steps of (i) analysing a device by means of generating impulses, storing the responses returned from an effect under analysis and performing various ‘tidying up’ algorithms as described below to create the stored impulse responses, (ii) reading an input sample and generating the sample, factor and address data for storage in memory as shown in FIG. 10, and (iii) executing the algorithm of FIG. 12 to generate each output sample after each input sample has been read in, compared with impulse response thresholds, and stored. A fixed or removable disc drive may also be provided for program storage, long-term storage of response data and exchange of data between machines.

FIG. 9 shows part of one method of implementing the simulation process wherein an input sample is analysed once to determine two impulse responses to be applied to it, where the start address of the impulse response stream in memory of the lower response appropriate to this sample is stored, and where the sample is divided proportionally as determined by the proximity of the sample amplitude to the two impulse response amplitudes ready for subsequent processing.

Figure 11:
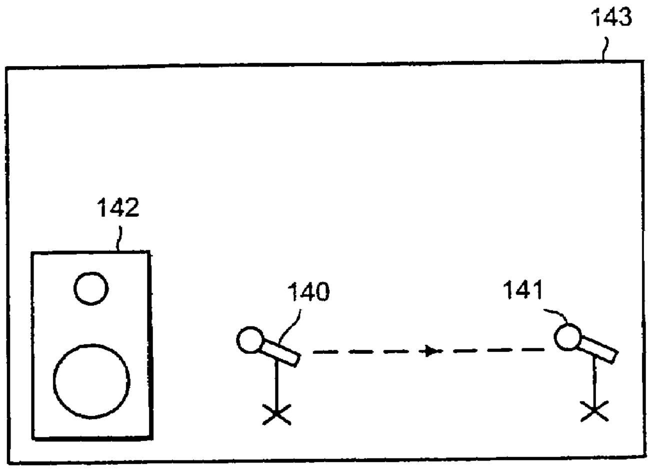
FIG. 11 shows an example of an alternative way of collecting a set of impulse response data to simulate novel compression effects.

FIG. 10 shows the algorithm to be applied to derive the values to be stored in FIG. 9, FIG. 11 shows the arrangement in memory after the most recent input sample has been divided and placed in memory at $F_1(0)$ and $F_2(0)$ together with the selected address of the lower of the two appropriate impulse responses stored at A(0). The previous samples derived values are stored at $F_1(1)$,$F_2(1)$, $F_1(2)$, $F_2(2)$ etc together with their associated A pointers for sufficient previous samples to at least equal the length of the impulse responses used in the simulation.

FIG. 12 shows the algorithm used to calculate an output sample from the data stored in memory in FIG. 11.

FIG. 13 shows one possible multiple processor implementation wherein DSPI is used first to analyse an effect and generate the sampled impulse responses, then is used during the simulation phase to generate the sample and factor memory entries. This memory is segmented into a number of areas each of which is accessible to its own DSP (2,3, 4 . . . ) which can thus calculate part contributions to each output sample. These part sums are then fed back to DSPI to be summed to generate the total output sample and fed to the output.

FIG. 14 shows an alternative way to implement the simulation algorithm where the heavily repeated inner loop of the convolution algorithm is simplified for maximum speed of execution requiring a simple multiply of each element of the impulse response buffer and accumulation into each element of the output sample buffer.

Figure 15:
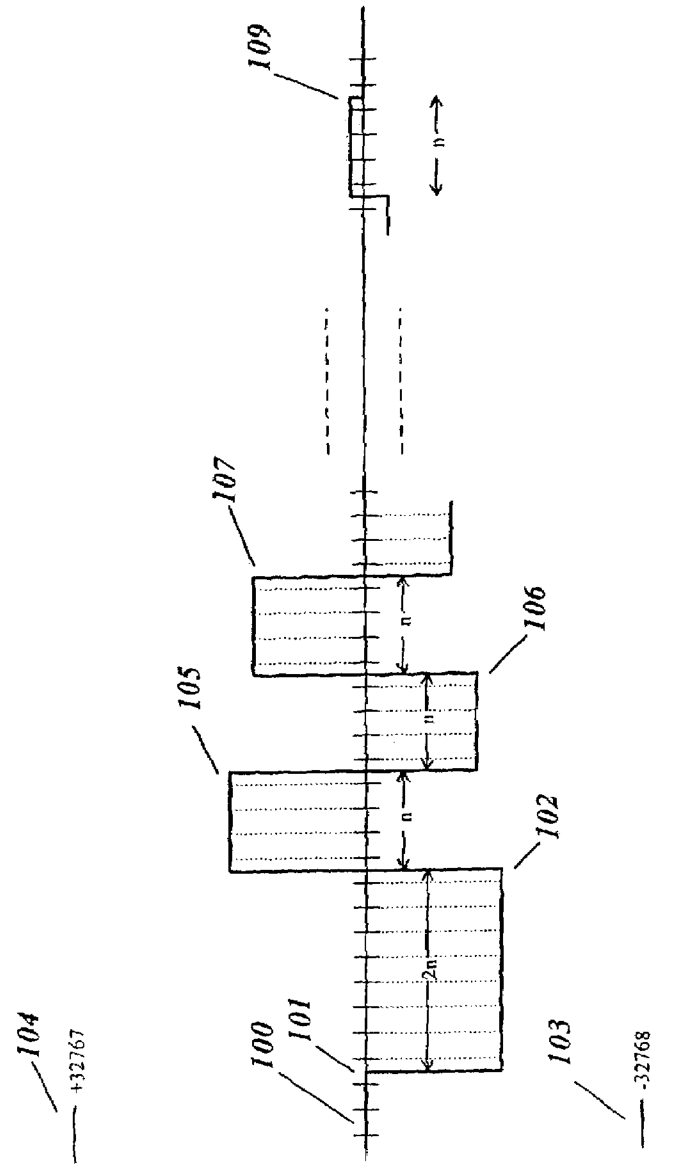

FIG. 15 shows the digital signal of an appropriate analysis tone which may be applied to a device under test remotely from the tone generating and analysis device by, for example, recording the test signal and applying it to the device under test and recording the impulse responses resulting for later analysis.

Figure 16:
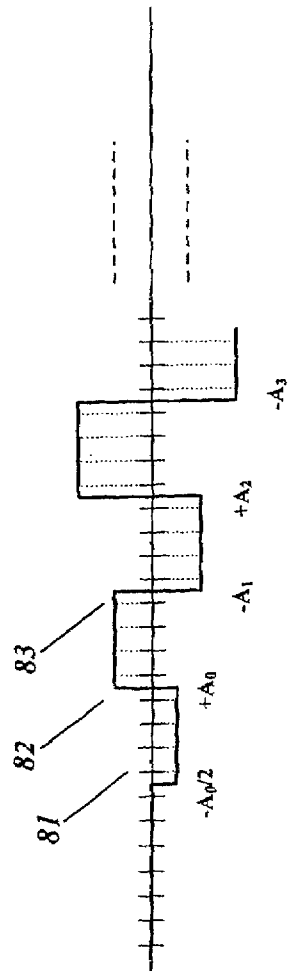

FIG. 16 shows an alternative test signal which may be used when the device under test is available at the same time as the generator and analyser device.

Figure 17:
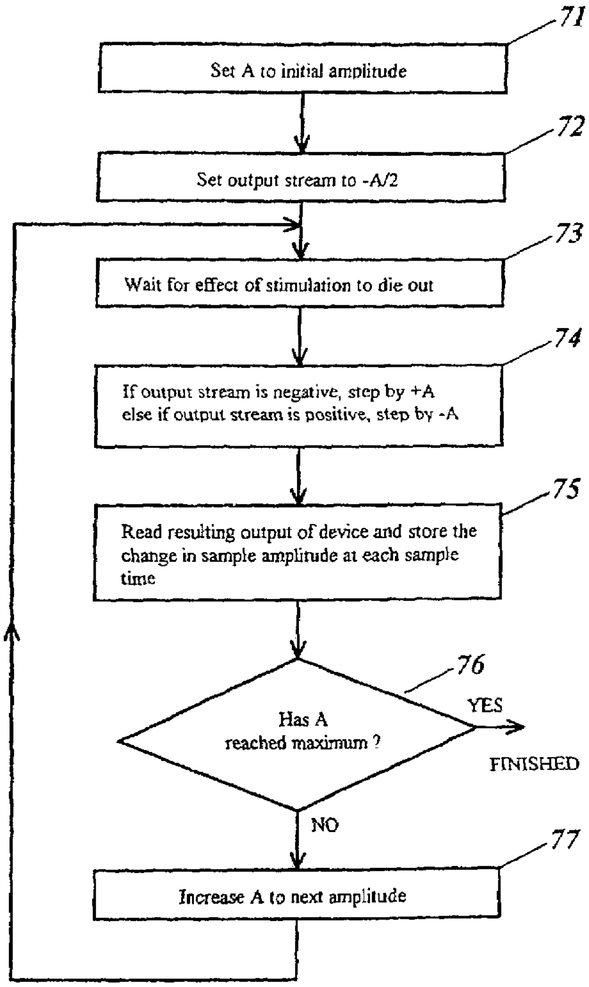

FIG. 17 shows a flow diagram of a process to generate the test pulses of FIG. 16 and record the impulse responses during analysis.

Figure 18:
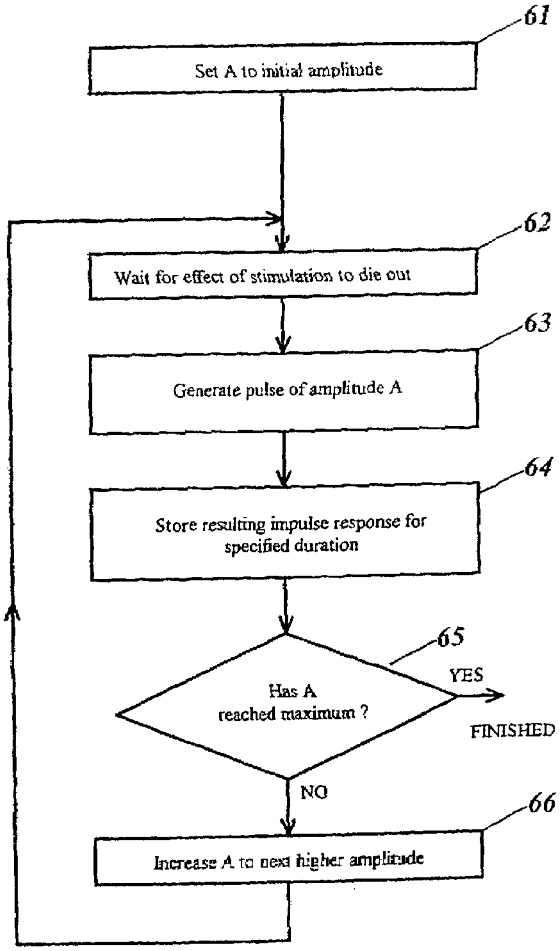

FIG. 18 shows a flow diagram of an alternative process to generate impulse test pulses rather than a stepped test pulse and to record the impulse responses during analysis.

Figure 19:
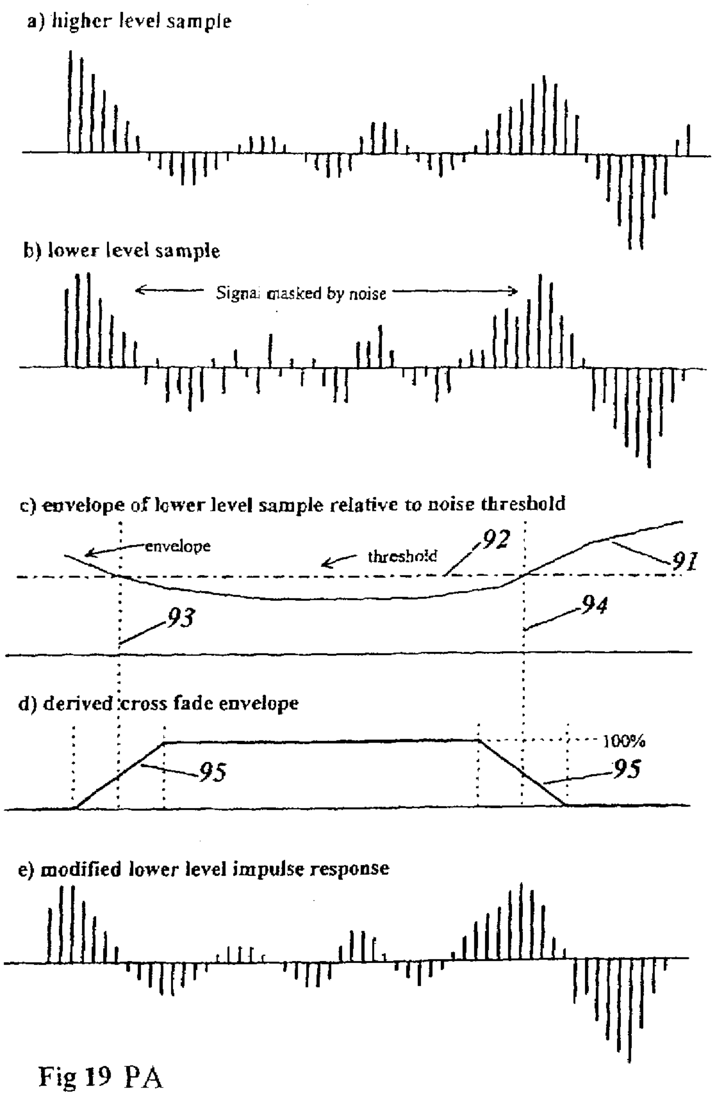

FIG. 19 shows a noise removal strategy where impulse responses derived from lower amplitude impulses may be selectively replaced by impulse responses from higher amplitude impulses in areas where the mean amplitude of the impulse response falls below a threshold representing the approach to a noise floor which would impair the simulation process.

Figure 20:
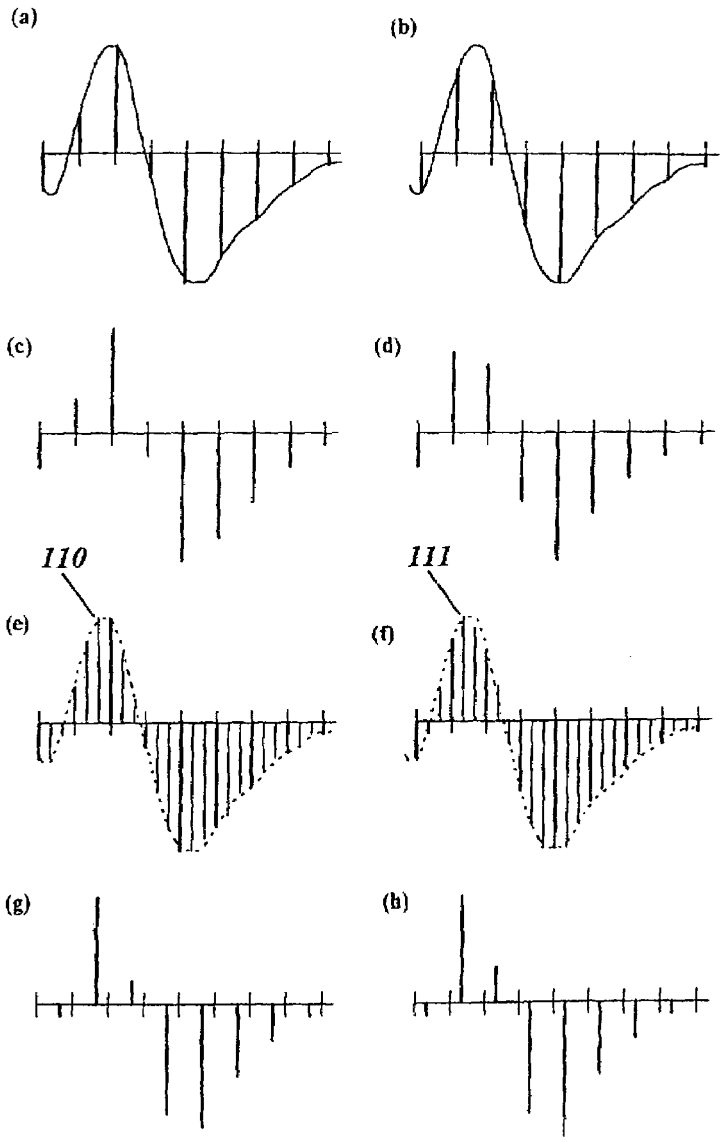

FIG. 20 shows the process of removing jitter from a signal recovered from a device or process under test, for example where there is randomised delay in the device (e.g. wow and flutter) or where the sampling process clock is not locked digitally to the analysis tone generator.

Figure 21:
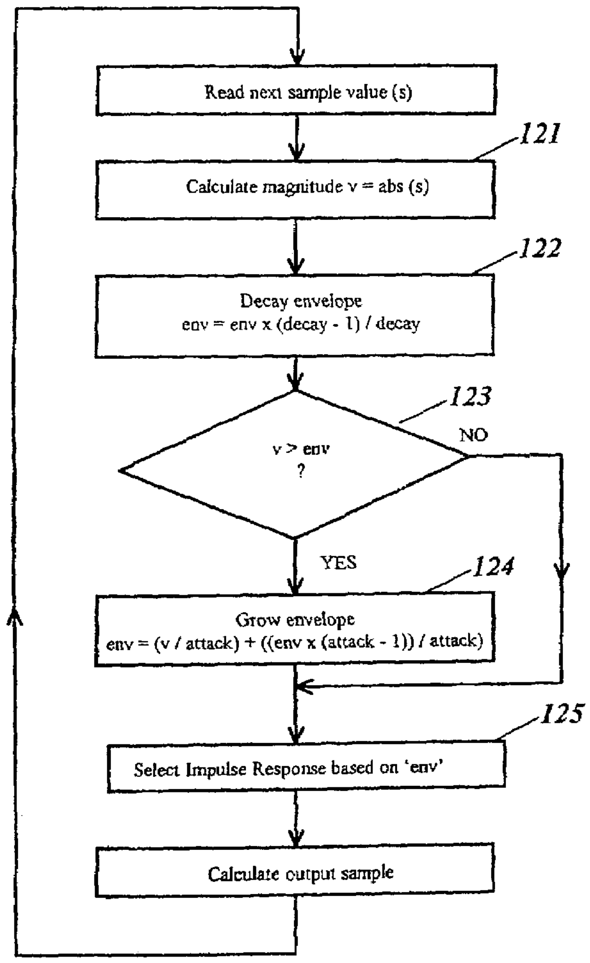

FIG. 21 shows the steps required to select between impulse responses based on the envelope of the incoming signal rather than instantaneous amplitude.

Analysis and Simulation of Linear Systems

It is known that the transfer characteristic of a linear audio processor can be characterised by its impulse response. A single pulse can be passed through an effect unit and the resulting signal which emerges can be recorded as a sequence of digital samples. The effect can then be simulated in the digital domain by convolving a digital input stream with this impulse response to produce a digital output stream which matches that which would have emerged from the sampled effect unit. The impulse response can be stored for recall later. This is illustrated in FIG. 1 where an impulse T is applied via a D/A converter I to produce an analogue impulse 2 which is fed into effect unit 3. The output impulse response waveform 4 is fed via digital to analogue converter 5 and the resulting impulse response R is measured and stored. FIG. 2 shows how the resulting impulse response R is used to calculate an output stream O from input stream I. The most recent sample received and output is suffixed 0, with progressively older samples suffixed 1,2,3 etc. Output sample O(0) is derived by taking the most recent input sample I(0) and multiplying this by the first sample of response R (R(0) shown at 7), summed (or accumulated) with the product of I(I) and the next older impulse sample (R(1) shown at 8) and so on until the oldest input sample required I(6) is multiplied by R(6) (shown at 10) is accumulated to make the latest output sample O(0). Thus the input stream of data I representing an input audio signal is convolved with the, single impulse response R to produce each sample in output stream 0. Although 6 samples are referred to here for the length of the impulse responses, this is for clarity only and in practice many more samples are used. Although multiple output samples are shown, in fact it is not necessary to store these values as a new output sample is derived when each new input sample is received and may be fed directly to the output.

Where the effect unit to be analysed already has digital input and/or output the D/A (1) or the A/D (5) may not be required as the digital signals can simply be fed to or fed back from the effect unit.

Extension to Non-Linear Systems

Many effects including some of those mentioned above are non linear in nature and the response of a signal path depends on the level of signal passing through the unit. According to this invention it is possible to analyse such an effects unit by applying a number of different impulses of different amplitude and to store a different resulting impulse response from each exciting impulse. This is illustrated in FIG. 3 for two different pulse amplitudes at FIG. 3(*a*) and FIG. 3(*b*). FIG. 3(*a*) duplicates the process shown in FIG. 1, using a sample pulse T of maximum amplitude to determine the response of the system under maximum amplitude conditions. FIG. 3(*b*) duplicates the test but using a lower amplitude impulse T, for example half the amplitude of the pulse in FIG. 3(*a*). The resulting impulse response is shown at R. This is then increased in amplitude to produce the response at R' by multiplying each sample by the ratio of the maximum sample amplitude at T over the lower sample amplitude at T'. This process is known as normalisation.

In practice, to obtain a good analysis of the non-linear response of the system, a number of different impulse levels are applied and a set of impulse responses (normalised to maximum amplitude) are obtained. Typically a set of 128 or 256 impulse responses are used using an equally spaced set of sample impulses from the maximum level down to 1/I28 (or 1/256 in the latter case) of the maximum level. In the case of 128 steps being used the response of the system is thus determined for signals from the maximum level down to 42 dB below this, at which point most effects have become linear.

After obtaining the set of impulse responses it is possible to simulate the non-linear effect. When simulating the effect it is necessary to examine each input sample and depending on the magnitude of the sample to use the appropriate impulse response in the convolution. This is shown in FIG. 4 for the case where the set of impulse responses uses just the two responses obtained in FIG. 3 and by comparison with FIG. 2. Each input sample (at I) needed to make up the output sample is compared against the threshold determined by the magnitude of the lower impulse of FIG. 3*b*, shown as chain-dotted line 11. If the magnitude input sample exceeds this threshold (i.e I(3), I(4) and I(5)), the impulse response of the higher amplitude pulse (shown replicated for each input sample considered at 12) is used in the convolution. If the magnitude of the input sample is below the threshold (i.e. I(0), I(]), I(2), I(6)) the impulse response of the lower amplitude impulse (13) is used in the convolution calculation. Once again all contributing products of input samples and appropriate impulse response are summed to generate the desired next output value O(0)

This process can be extended to use the impulse responses of any number of different impulse amplitudes by comparing the input sample against a number of thresholds. In the example where there are 128 equally spaced test impulses used to derive the impulse response set, the appropriate response to use for any sample can be simply obtained by truncation of the magnitude of the sample to 7 bits (equivalent to 128 levels). The magnitude means that the sign of the sample value is removed to determine solely its amplitude.

In fact it can be seen that the number of calculations required to generate an output sample is increased only by the need to make a decision for each input sample. The decision needs only to be taken once for each input sample (regardless of how many times this sample needs to be used to calculate subsequent output samples) so in fact represents only a small increase in computational complexity. This is shown in the later detailed description of the process of simulation. Thus it is possible to use a large number of different impulse responses representing, say, 128 different sample levels without increasing the number of calculations by anything like the number of levels used.

Whilst the principle implementations described here take a single impulse response at each level and disregards the sign of the input signal during simulation (using only the magnitude for determining which impulse response to use), it is possible to simulate effects which have significant asymmetrical response by storing responses to both positive and negative going transitions, and applying the one appropriate to the sign of each input sample as well as magnitude.

Improvement by Linear Interpolation of Impulse Responses

Whilst the above process provides a simulation of the sampled effect. an improvement in distortion characteristics can be made if desired at the expense of some increase in computational complexity by modifying the process so that instead of selecting between two different impulse responses-at a given level, a cross-fade effect is used applying a proportion of the input sample to two impulse responses representing two adjacent impulse levels. This is shown in FIG. 5 where a sample (14) a quarter of the way between two sample thresholds (15, 16) is applied three-quarters to the impulse response representing the lower sample level (17) and one quarter to the impulse response representing the higher sample level (18). No calculation needs to be performed with any of the other impulse responses. The computational complexity has thus doubled over the simple case of FIG. 2 plus the additional computation to compute the ratio between the two levels. Although this represents more complexity than of the simple case of FIG. 2, it still represents an acceptable level of complexity to achieve the non-linear characteristic of many simulated effects, as once again this can be evaluated just once for each input sample.

Switching Between Modes

In fact the simulator can be made to switch between the three cases of the simple linear simulator of FIG. 2, the non-linear simulator of FIG. 4 and the improved non-linear simulator of FIG. 5 according to the available computational power and according the length of the impulse responses used. This switching can be achieved by changing the stored program executed by the DSP processors used to implement the system.

Reducing Noise in the Sampled Impulse Response Using an Alternative Sampling Pulse The analysis pulse of FIG. 1 generates an impulse response but the resulting impulse response may also contain noise. Low frequency noise tends to be correlated between adjacent samples and during the resulting simulation phase may lead to either large DC offsets or general low frequency noise on the resulting output.

FIG. 6 shows that instead of the unit impulse test signal T of FIG. 1 the step pulse ST may be applied. The step response SR is thus obtained.

FIG. 7 shows how to recover the unit impulse response required R. The step impulse response SR is shifted on by one sample to get SR' which is subtracted sample by sample from the response SR to yield the desired impulse response R. Thus any substantial correlation between samples is largely eliminated, and any DC offset (i.e. a constant bias found on all analysed samples) is totally removed. This can of course be calculated as the impulse response is sampled by storing the previous sample value $S_{n-1}$ and subtracting it from the current sample $S_n$ so the value $S_n - S_{n-1}$ is stored as the desired impulse response.

The desired response at the required number of different amplitudes can be found by using steps of a number of different sizes, as shown in FIG. 15 and described later.

Implementing the Analysis and Simulation

The implementation of the analysis and simulating process will now be described by reference to figures S to 18. FIG. 8 shows one arrangement using a stored program computer optimised for digital-signal processing. Typically one or more digital signal processor (DSP) devices 21 are used. The DSP is attached to memory for impulse responses 22 and for digital audio sample, accumulation and control data 23, as well as program memory 24. These may in fact be part of a single general purpose memory array or for example the program memory 24 may be part of a separate array for higher performance. Audio input is provided either via analogue to digital converter 25 or via direct digital input 26 and audio output is fed via digital to analogue converter 27 and via a direct digital output 28. A disk storage subsystem 29 is also connected and a user control panel and display 30 is provided to allow the user to initiate analysis, store or select stored impulse responses, and select simulation modes, as well as initiate editing of impulse responses as described later.

The arrangement of FIG. 8 may generate the analysis pulses, store and process the resultant impulse responses, and produce the simulation by loading the appropriate control program from disk or other storage medium.

One method of implementing the process of simulation will be described first.

FIG. 9 shows the process of reading in samples to be processed. A number of impulse responses derived from the analysis phase are stored in arrays of memories shown at 31, 32 and 33. Three are shown but in practice any number may be used. These are identified by the address in memory of the first element of each response at 34, 35 and 36 and the memory array A can store these memory addresses, or pointers, represented by the arrows shown from memory elements of array A pointing to the appropriate impulse array. Each input sample arriving has one element of A reserved for it to denote the appropriate pair of impulse responses 31–33. The pointer addresses the lower of the two impulse responses (i.e. the impulse response derived from the lower magnitude analysis impulse) representing the threshold on or below the input sample, and the second impulse response is always the next one above representing the next higher threshold level of the input sample.

Memory arrays $F_1$ and $F_2$ store a pair of factors which are derived from the input sample and represent the input sample divided into two parts, one of which will be applied to the lower impulse response and one of which will be applied to the higher impulse response. The sum of these two factors is always the input sample value itself and the sample is divided and stored in elements of arrays $F_1$ and $F_2$ according to the proportion to be applied to each impulse response. Each input sample 37 therefore is divided in process 38 and loaded into the next free set of elements of the arrays A, $F_1$, and $F_2$. A pointer 39 is then incremented (to the left in this example) to point into the next set of elements for the next input sample when it arrives.

FIG. 10 shows by means of a flow diagram the details of the process 38. The magnitude /S/ of the input sample S is compared with the various thresholds $T_1$, $T_2$ etc representing the levels at which the impulse responses were sampled, to find the two thresholds $T_n$, on or below the sample magnitude, and $T_{n+1}$ above the sample magnitude, i.e. such that It should be noted that if the number of equally spaced levels is a power of 2 (e.g. 256) the threshold value $T_n$ can be determined by first removing the sign of the sample value then truncation to the number of bits appropriate to the power of 2, (e.g. 8).

The next step is to calculate the proportion by which the sample amplitude exceeds the threshold (shown as factor k), then divide the sample in this proportion to place into arrays $F_1$ and $F_2$.

The input pointer is then advanced ready for the next sample. The array stored will be used for calculating each output samples up to the length of the impulse responses, so after a number of output samples the values just calculated will no longer be required. Standard techniques may be applied to implement a 'circular buffer' where the pointer can be wrapped back to the start after this many samples. thus limiting the size of the arrays. These techniques are well known and do not need to be described further here.

FIG. 11 thus shows the layout of data in memory after a number of samples have been read in and processed to calculate output samples (ignoring any issues relating to circular buffers). In this example and in the process shown in FIG. 12 the parenthesised suffix (0) is used to indicate a value relating to the most recent sample, (1) the next older and so on. For the impulse response the suffix (0) means the first sample in the impulse response buffer (i.e. the first that arrived during the analysis process), (1) the next older etc up to (M−1) which represent the most delayed impulse response sample, where M is the number of samples in each impulse response buffer.

FIG. 12 shows the flow diagram to calculate each output sample. It comprises a main loop starting at 43 which is executed M times for each output sample by means of the control variable J which is zeroed at 41. The output sample is accumulated into the variable $S_{out}$ and so this is zeroed at 42 before entering the loop. The first step in the loop at 43 (for the element J) is to load the impulse response pointer A(J) (being the Jth element of array A). Using this pointer it is possible to load the appropriate impulse response sample from each of the appropriate response arrays. These are referred to as I, read from A(J)+J (at step 44) and $I_2$ read from A(J)+J+M (at step 45).

The two parts of the input sample $F_1$ and $F_2$ are read from the $F_1$ $F_2$ arrays at offset J at step 46. The two multiply and accumulate steps can be performed to accumulate the output sample into $S_{out}$ as shown at step 47. It is then only necessary to increment J (at step 48) and to test this against M (at step 49). When J reaches M the output sample is complete and the loop is finished.

The output sample value may then be fed to the output of the machine (FIG. 8 items 27 and 28). Input pointers can then be moved on one sample ready for the next input sample.

It should be mentioned that if either of the two simplified processes of FIG. 2 or FIG. 4 is to be carried out some simplification of the above processes can be employed. For example, if cross-fading is not to be employed (as described in FIG. 4) the sample is not divided between $F_1$ and $F_2$ but is simply stored wholly in array $F_1$. Thus all $F_2$ values are considered to be zero and so the memory array is no longer required and any steps relating to $F_2$ can be by-passed, i.e. step 45, the second read at step 46 and the second multiply accumulate at 47. If the basic linear simulation of FIG. 2 is required the process is further simplified to eliminate determining the threshold of the input sample, it is simply stored in array F1. Only one address of impulse response is needed so array A is now no longer required and in FIG. 12 step 43 is not required and the sole base address of the one impulse response is used instead of A(J) at step 44.

It will be appreciated that the number of operations can be substantial as the length of the impulse responses used (M) may typically be 5,000 or longer (although useful results can be obtained with responses as short as for example 50 to 200 steps). Accordingly, and depending on the speed of the DSPs it may be necessary to use more than one DSP to operate in real-time.

FIG. 13 shows one possible architecture of a multiple DSP implementation. DSP 51 processes the input sample into the arrays A, $F_1$ and $F_2$ as already described but which are stored in segmented memory arrays 52. This memory is arranged so that it can be wholly accessed by DSP51 for loading with processed input samples, but is separated into sections which can be individually accessed by DSPs 53, 54, 55 etc. Each DSP thus has access to part of each array and for each output sample can perform part of the multiply accumulate loop described in FIG. 12. The resulting parts of the accumulated output sample are written back to more shared memory 56. DSP 51 (which otherwise is not heavily occupied by the input process) then adds all the separate parts together to produce the whole output sample. Thus for example ten processors (53, 54 etc) could be used so that each performs 500 accumulation steps per output sample, and DSP 51 then has to sum the 10 partial values. Thus 5,000 step impulse responses may be subdivided as appropriate to the speed of the DSP processors. Each DSP 53, 54 etc is effectively executing the same program and so may be fed from either the same or separate program memories 57, 58 etc. It is only necessary to map each part of the memory 52 to appear at the same address location in each associated DSP.

It should be mentioned that there are other ways of dividing up the process which is functionally identical, producing identical output for the same data. For example FIG. 14 shows a rearrangement of the process so that the bulk of the processing is done for each input sample, accumulating output as the input samples appear. After the Mth input sample is accumulated into the output sample buffer the first output sample is ready for output. Thereafter after each input sample is accumulated, another output sample is available. This arrangement may suit some DSP architectures better depending on the exact nature of the DSP's instruction set.

Methods of generating 3 alternative analysis pulses will now be described by reference to FIGS. 15 to 18. Other methods are clearly possible.

FIG. 15 shows details of a digital analysis step tone to be applied to a device under test appropriate to a 16-bit digital audio system. Other bit resolutions would require the amplitude of the steps to be varied appropriately in proportion to the resolution. This figure shows an analysis tone with 128 positive transitions of reducing amplitude designed to obtain 128 impulse responses. It also generates 128 negative going pulses which produce responses which can be ignored, or stored if it is desired to analyse and simulate asymmetric performance.

The digital signal to be fed to the device under test (via a D-A converter if the device is analogue) starts at value zero shown at 100. The maximum positive value the signal can reach is shown at 104 to be value 32,767, and the maximum negative value is shown at 103 at −32,768. These are the limits for a 16-bit linear sampling system. At the commencement of the tone at 101 the signal steps negative to a value of −16,384, and remains at this level for 2n samples. The diagram shows a value of n of 4 but in practice a value of n of 4,000 is typically used. After 2n samples, at 102, the signal steps to +16,384, resulting in a positive step of 32,768 which in magnitude represents the largest amplitude of an individual sample in any 16-bit audio stream. Note that at each transition from negative to positive, the step is always twice the magnitude of the negative value.

After a further n sample, at 105, the value steps to −16256. In fact at each negative going transition (107 etc.) the step is to a negative value 128 less in magnitude than the positive value currently being output. Thus the following negative to positive step (at 106 etc.) is 256 less in magnitude than the previous one.

Thus the sequence of 128 positive steps interleaved between the negative steps have the step amplitudes of 32768, 32512, 32256, 32000, 31744, . . . 512, 256.

After the final upward transition to value 128, the final transition at 109 is by −128 to 0. At this point the analysis tone is complete.

The step impulse responses sampled into the analyser may be stored as it arrives (see FIG. 6) for later processing by the method of FIG. 7, or the difference signal required may be derived as the data arrives by subtracting the previous sample value from each sample value as it arrives. There are some benefits of postponing the step of deriving the difference signal until later as it is easier to analyse the noise floor of the system with the unprocessed signal during noise removal or level detection operations described later.

Normally the impulse responses derived from the positive going step impulses only will be used, normalised according to the manner described. If the negative going pulses are also to be used to simulate asymmetric devices, the responses resulting from each negative going transition following each positive going one can be stored and normalised by multiplying each sample value by 32768 and dividing it by the (negative) amplitude of the appropriate step transition. Although the negative transitions are slightly smaller than the positive going ones the resulting responses may each be used as if they were for the matching positive impulse transition with negligible loss of accuracy of the simulation.

A further point about the value of n is that this represents the maximum length of impulse response to be derived from the device under test. Although 4000 is a typical value a larger number must be used if the device under test continues to generate significant response to an impulse for more samples than this. To assist in the later analysis of the tones it is recommended that a multiple of 1,000 samples is used for this value This signal may be applied directly to a device under test and the resulting impulses recorded for immediate processing and use, or it may be recorded (for example on a digital tape recorder) for application to the device under test at another place or time. In this case the response of the device under test should also be recorded (preferably with the same sample clock as that used for applying the test signal) and may later be fed back into the analyser system described. The analyser can be set to search for the first significant amount of signal which represents the device under test's response to the transition 101, and from this point determine each response to positive transitions spaced at 2n sample intervals. Where the sample clock has differed slightly between the analysis tone and the response sampler, or there is some intrinsic variable delays (for example wow and flutter of a tape recorder) the jitter removal techniques described later can be applied.

The resulting impulse responses are processed by any noise removal algorithms required and the difference signal is derived. The responses are normalised and appropriately windowed for use in simulation.

The process of normalisation requires increasing the amplitude of the impulse responses derived from lower level impulses. It is important not to distort these amplified responses, for example by letting them 'clip' to the peak level storable in the digital representation. A preliminary inspection of the data should be performed to determine any such problem and an attenuation factor generated which is applied equally to all the impulse responses in the set so as to prevent such distortion occurring. This must be done regardless of which method is used to generate the analysis tone.

FIG. 16 shows an alternative test signal which can be applied and FIG. 17 shows a flow diagram describing the process of generating this signal. This method may be used when the device under test is physically connected to the tone generator and analyser device and takes advantage of the fact that the duration of each impulse response can therefore be measured, allowing the impulse response size to be best fitted to the device under test. Where the length of impulse responses desired is limited by other considerations, for example by memory or processing time limitations, it is still possible to wait before applying a subsequent test pulse until the device under test has ceased generating a response to the previous pulse.

Although in this case the sequence is described for a steadily increasing test signal, a decreasing test signal as already described may be used. Values suggested are appropriate to a 16-bit environment where 128 impulses in each direction are required.

Referring to FIG. 17, at step 71 the initial minimum amplitude value is selected. The output stream from the pulse generator is set to the value $-A_0/2$ at step 72 (typically $A_0$ is 256), producing the output step 81 in FIG. 16. At step 73 it is necessary to wait for any resulting response from the unit under test to die out. This will be determined by recognising when the non-DC component of the signal has stopped varying or has reached the noise floor which may be determined before the first stimulation is applied. It would generally be advisable to apply to time limit which can be user selectable in case of a varying noise floor causing an indefinite wait.

The test signal is now generated by stepping the output stream by the amplitude A, by stepping in a direction to cross the zero value, as described at step 74. This is shown at 82 in FIG. 16 for this first value. The resulting output of the device under test is now monitored and stored as the step impulse response (step 75).

At step 76, value A is tested to see if it has reached the maximum step desired (typically 32,768) and if not it is increased (typically by 128) to the next amplitude to test (step 77). The process then loops back to step 73 where any residual response to the stimulation is allowed to die out, then the output is stepped again, this time in the opposite direction. This is shown at 83 in FIG. 16. Once again the output stream is monitored and the signal is stored.

As for the previous signal of FIG. 15, the resulting impulse responses are processed by any noise removal algorithms required and the difference signal is derived. The responses are normalised and appropriately windowed for use in simulation.

Although step impulses are normally used, it is possible to apply simple impulses as suggested in FIG. 3, and FIG. 18 shows how the algorithm of FIG. 17 may be modified to carry out this process. Once again this shows the application of steadily increasing pulses but of course the larger impulses may be applied first. There is a slight benefit of steadily increasing the pulses as any residual effect from a previous impulse will be slightly less than if the pulses are decreasing in value but in practice there are benefits in level setting for example which outweigh this.

In FIG. 18 at step 61 the initial amplitude is typically set to 256. At step 62 it is desirable to wait for any residual effect of a previous signal passing through the unit under test, as some effect devices may continue to generate output for some time after stimulation, for example due to resonances or reverberations. This process is done by monitoring the return signal from the device under test and observing the noise floor. If this is decaying over a short space of time the process simply waits for the noise floor to become stable.

At step 63 a test pulse of the desired amplitude is emitted by setting the output stream to the value A in one sample period and back to zero at the following sample. At step 64 the returning stream is monitored and stored (usually into RAM) until the time limit set by the implementation is reached. This is determined by the number of steps which the simulator can process in real time, or can be limited by memory available or be further limited by user intervention to minimise processing requirements. It should also be noted that the process of step 62 can also be followed to determine when there is no significant further response and further used to shorten the sampling process.

Once the sampling is complete the amplitude is tested at 65 to determine if the process is complete (usually when the signal has reached 32678. If not, the next higher level of amplitude can be loaded into A (typically increasing it by 256) and the loop repeated. Note that an impulse of 32768 cannot in fact be generated in a 16-bit system but the maximum value 32767 can be used with insignificant loss of accuracy.

A useful refinement to any of the above analysis pulses is to allow the system to generate a continuous stream of pulses at user definable amplitudes solely for the purpose of allowing the operator to select the optimum levels of signal to pass through the device under test.

It should be noted that the step of waiting for any residual stimulation of the device under test (shown at step 62 of FIG. 18 and step 73 of FIG. 17) may be replaced by a fixed wait period in many instances where there is not significant energy storage in the device under test. This has a benefit that the output test signal becomes the same for any test and as in the case of the signal of FIG. 15 may be recorded (preferably in digital format) for application to a device remote from the analysis machine. The resulting output from the device under test may also be recorded and can later be analysed by the analysis process. The only significant alteration to the process of analysis is that instead of generating the test pulse it is necessary simply to wait for any significant response to appear in the recorded stream and store this and the following impulse response as being the response to the first test pulse, then similarly wait for the appearance of further responses to later pulses and thus obtain a complete set of impulse responses. This is useful as an operator may simply carry a tape of the test stream and if he encounters a device which he wishes to analyse he simply plays the tape through the device and records the result for later analysis and simulation. A useful refinement to improve this process is to precede the test signal with a short burst of tone which both can be used for level setting and can be recognised at the analysis stage and taken as a trigger to start the process of looking for response signals at a known period after the tone burst.

Although the sampled effect is shown as an analogue device, a digital processor may be sampled by applying the sample impulse directly to the digital input and sampling directly the output impulse response.

Improving Noise

A potential problem with the system is that significant noise generated by the device under test will appear as noise in the simulated effect. This can be made worse when using impulse responses derived at low levels of test. However since many effects become linear as the level through the device decreases it is often just necessary to use a set of impulse responses derived at relatively high levels, and below this threshold of linearity, to use the impulse response derived at the highest linear level in place of all lower impulse responses. This can be done under manual intervention from the operator who can choose a balance between desirable non-linearity and acceptable noise by auditioning the effect of selective replacement.

Where it is not possible to achieve a desirable balance because it is desired to preserve lower level non-linearities where noise is a problem, it is possible to selectively modify parts of the impulse responses derived at low levels by replacement with matching parts of the responses from higher level impulse responses, where the areas to be replaced are determined by evaluating the absolute amplitude of each section of the response and replacing it where the impulse response is seen to be near the noise floor.

FIG. 19 shows some details of this process. A higher level impulse response is shown at (a) and a lower level one at (b). An envelope 91 (at (c)) is generated representing the average level of a local region of the impulse response (b). This is evaluated by calculating the RMS value of the nearby samples, weighted towards the current time for each point in the envelope. In practice this may encompass 400 to 500 samples if the impulses used are say 5000 samples long, or smaller ranges if shorter impulses are to be used. The envelope 91 is compared with a threshold 92 which may be user determined or estimated by comparing with the noise floor determined either by monitoring the device output under no signal conditions. In FIG. 19 (*c*) it can be seen that the example envelope 91 falls below the threshold at 93 and rises again above it at 94. From this a 'cross-fade envelope' is generated (d). Using this envelope the impulse response (b) is selectively replaced with impulse response (a) with a soft crossfade of several milliseconds at each end of the replacement (shown as the ramps 95 of the cross-fade envelope) to generate a new impulse response (e) where the lower level area is replaced by the lower noise floor impulse response taken at the higher level (a).

The new impulse response is generated according to the formula where e is the cross-fade envelope value, a is the sample value from the higher level impulse response and b is the sample value from the lower level impulse, and r is the resultant sample to replace in the lower level sample. The period (.) represents multiplication. This provides a cross-fade to the higher level impulse response where the lower level signal was below the threshold.

To determine the noise floor automatically it will be seen that for the impulse responses taken at lower levels there will be a level which the envelope never drops below due to noise. The threshold can thus be set say 50% above this and applied progressively from a higher level sample down to the lowest level. It is appropriate to start the process at the impulse response some 12 dB below the maximum, in other words that sampled with a sample pulse about a quarter of the amplitude of the highest sample impulse used.

Length of Impulse Responses and Processing Power

The impulse response lengths required depend on the energy storage characteristics of the effect sampled. Typically an equaliser, valve amplifier or speaker/microphone combinations in short reverberation environments can be simulated with impulse times of up to 1/10th second, or for example 5,000 samples. Each output sample will require the accumulation of 5,000 values of input sample multiplied with 5,000 impulse response samples, or 250 million operations per second assuming a 50,000 sample per second sampling rate. Thus the simple case of FIG. 2 requires 250 million multiply accumulates (MAC) operations on linear arrays of data, while the process shown in FIG. 12 requires correspondingly more steps to be repeated this many times.

Some valve processors and tape-recorders have very short impulse responses and a useful simulation can be achieved with responses as short as 200 samples.

To simulate fully reverberant effects, impulse responses of several seconds can be needed resulting in a proportional increase in processing power. This is quite possible within a network of DSP chips. To make the best use of a particular hardware implementation however the simulator should be arranged to switch amongst the three simulation methods described: the linear simulation of FIG. 2, the simple non-linear simulation of FIG. 4 and the interpolated simulation of FIG. 5 (shown in greater detail in FIG. 8 onwards). This means that in simulations where non-linearity is not required more processing power is available for longer impulse responses and therefore longer reverberant periods.

Windowing of Impulse Responses

It should be noted that where an effect is sampled but the impulse response exceeds the length of sample which it is possible to calculate in real-time in a particular hardware implementation, it is necessary to truncate the impulse response by windowing the response, i.e. effectively fading off the last 1/20th second or so linearly to zero. In fact all sampled impulse responses should be windowed in this way to prevent any glitch effects from suddenly truncated noise signals. Where impulse lengths are short the fade out typically would be across the final quarter of the response signal.

It is also beneficial to apply a fade-in ramp over the first few (for example, 10) samples of the derived impulse response, and for this purpose it is desirable to store a few samples before the actual impulse response is received so this fade-in takes place over the residual noise of the system.

Editing Impulse Responses

Trimming the Start and End

There is always some delay between the application of an impulse to a device and the output response. This results in an equal delay in the simulation. Sometimes the effect can be improved by removing or reducing this delay and in any event this shortens the sample to reduce computational requirement. It is simple to arrange for the operator to trim off samples from the front of the sample—the effect of which he can audition to his taste, or a threshold level can be set on a response to automatically trim off any initial response below this 'noise' threshold. This threshold would typically be applied to the impulse response derived from the highest level sampled signal and once determined, the same amount is trimmed off the start of the whole set of impulse responses.

Frequency Shifting

Interesting variations of the sampled effect may be made by re-sampling each impulse response to a higher or lower frequency using standard re-sampling algorithms. The effect of each change can be auditioned to the taste of the operator. This allows various effects, such as for example the resonances in the sampled effect being matched to dominant frequencies in the signals to be processed.

Combination of Effects

It is possible to simulate the effect of passing a signal through two successive effects by taking each impulse response of the first effect and passing it through the simulation of the second effect to generate a new impulse response for that sample amplitude. This is done for each impulse response of the first effect to achieve the same number of new impulse responses representing the combined effect. In the case of the simple method of FIG. 2 this represents s simple convolution of the impulse responses.

Interpolation and Extrapolation Effects

The set of impulse responses representing the range of levels passing through an effect embodies the non-linear characteristic of the sampled effect. New and interesting effects can be achieved by partially linearising the effect. To do this a subset representing a range of the original set is taken and a new complete set of impulse responses is generated by interpolation of each sample step through the set of impulse responses.

It is also possible to make the non-linearity more extreme by extrapolating beyond the original range. This can result on extreme values of samples and generally the whole sample set will have to be attenuated to keep the output within acceptable limits.

After any such recalculation the operator can again audition the effect to achieve a desired effect. The extrapolation effects will generally become very strange but small amounts of extrapolation may generate desirable distortions.

Arithmetic

As with all good signal processing practise care must be taken with rounding or truncation of digital value. It is best to preserve precision of all calculations to, for example, 32-bits if fixed point arithmetic is used of 24-bits of mantissa if floating point is used. Final digital output can be reduced to the desired digital output format using appropriate and known bit reduction techniques.

Storing Only the First N Responses of a Set

It has been stated that at low levels the impulse responses can become lost in the noise of the device under test. Accordingly the operator can determine the lowest level impulse response which it is desired to use. Below this in the simulation the lowest specified impulse response is used for all lower sample values.

Accordingly it is not necessary to store the data for the impulse responses that will not be used, but simply to store an indication that the last specified response be used for all lower level samples.

When reloaded for implementing a simulation according to the embodiment of the invention described, the impulse response derived from the lowest level exciting pulse stored is simply replicated to complete the set.

It should be mentioned that an alternative embodiment may change the simulation algorithm so that although sample levels above the lowest level impulse response are subject to selection and interpolation between the appropriate higher level impulse responses, those below the lowest level impulse response present are simply applied to this lowest level response without the need for interpolation. In this situation there is no need to replicate the lowest level response defined in the stored set of data.

Precision of Sampling Clock

In generating a set of impulse responses corresponding to different amplitude impulses it is important that each impulse response is closely correlated with the others. In other words the relationship between the exciting pulse and the resulting response of the device under test must be strictly linked. This requires that the digital input sampling system is locked to the digital output system generating the analysis tone. In addition long term clock accuracy should adhere to good audio design practice so that some time into each impulse response, impulse samples remains correlated between different impulse responses in the set.

In the event that this requirement cannot be met it is still possible to extract a usable impulse response set by means of jitter removal.

Jitter Removal

Where it is impossible to guarantee high accuracy between the timing of the analysis tone and the resulting impulse responses, for example where the impulse response is recorded and reproduced later for analysis, or where the device under test introduces small timing errors (for example when sampling an analogue tape recorder with its intrinsic delay between recording and replaying), it is necessary to re-correlate the impulse responses.

FIG. 20 shows two successive impulse responses at (a) and (b). These are samples at the time intervals indicated by the vertical lines, giving digital samples as shown at (c) and (d). Although the impulse responses are apparently very similar (as would be expected where the exciting impulse was only slightly different in amplitude), due to the fact that time correlation has been lost between the analysis tone and the resulting impulse response it can be seen that the digital signals appear very different although they represent a broadly similar underlying (analogue or implicit) signal. They are thus not suitable for use as members of an impulse response set until the timing inaccuracy is removed.

This may be corrected by up-sampling the digital signal (to n times the original rate, where the diagram shows the case for n=3) by known means (typically accumulating a 'sinc' function for each sample in the digital stream) to achieve the digital signal as shown at (e) and (f), where the interpolated new samples are shown as thinner vertical lines and the underlying (implicit) wave-form is shown dotted.

It is now possible to look for a recognisable characteristic of each signal and typically this can be done by looking first for the peak amplitude of the first impulse response. This is clearly the sample shown at 110. This impulse response can now be decimated to the original sampling rate simply by taking every nth sample to generate the new digital signals at (g) and (h).

For each subsequent impulse response it is now possible to look for the largest amplitude sample with a matching sign to that of the first impulse response (for example that shown at 111), and similarly decimating each impulse response so that this highest point is now precisely correlated with that of the first.

In fact, up-sampling by 64 times together with this pattern matching algorithm gives good results for the example of analysing an analogue tape-recorder, where the impulse responses have a clear initial peak. Higher up-sampling rates may be used if higher precision is desired. Other pattern matching algorithms may be used including allowing the system operator to match the patterns by hand and eye by overlaying images of the digital representations on a display screen. This would be more appropriate for extreme devices under test with very complex impulse responses.

Smoothing Over a Range of Impulse Responses in the Set

An impulse response measured at one time may vary slightly from one taken at another time due to various random variations in the device under test. For example when analysing an analogue tape recorder instantaneous gain can vary due to inconsistencies in the tape medium.

Ideally a number of measurements should be taken and the impulse responses for each amplitude excitation pulse can be simply averaged on a sample by sample basis to smooth out these variations. This also reduces the effects of noise in the device under test. For the example of an analogue tape recorder typically 16 sets of measurement may be taken but this depends on the device and auditioning the results obtained. The number of measurements can be increased until a desirable quality of simulation is obtained.

A faster and more convenient way of achieving almost as good results can be achieved by recognising that each impulse response of the set obtained in a single analysis run with the analysis tone differs only slightly from other responses near to it in the set. This is because the variation in impulse response encapsulating the non-linear characteristic of the device under test is generally a gradual one.

Accordingly it is possible to average a number of adjacent impulse responses (on a sample by sample basis) to create a new impulse response. Typically, for the example where there are 128 impulse responses in the set, and it is chosen to smooth over 8 impulse responses: The first impulse response is replaced by the average on the first 8 impulse responses. Then the second is replace by the average of second to the ninth response, the 3rd by the average of the 3rd to the 10th, etc, until the 120th is replace by the average of the 120th to the 128th. This final average is also used to replace response 121 to 128, resulting in a linear lower end of the simulation.

Where the lower level impulse responses are not available because they have not been kept, (for example if they were not stored after the operator decided that they were too near the noise of the device under test), the averaging process must stop n responses from the end, where we are smoothing over n responses. The set of responses is thus reduced by (n−1) and the new last response is used for all lower level samples in the simulation.

Selecting Between Impulse Responses Based on Envelope

The non-linear synthesis has been described where the selection between impulse responses of a set and the relevant interpolation is based on the instantaneous sample value for each sample, as shown in FIG. 10.

Useful variations in the simulated effect can be achieved by substituting for the sample level the envelope of the audio signal being processed. This can be implemented by providing user control over two additional parameters, referred to here as 'attack' and 'decay' The effect already described in FIG. 10 (for the system where only the amplitude of the input sample is considered for the selection criterion) is produced when both these parameters are set equal to 1.

The envelope may be generated by maintaining an ongoing variable named here 'env'. At the start of the process this may be initialised to zero and will quickly attain its correct value.

The flow chart for calculating a new value for the envelope 'env' for each input sample is shown as FIG. 21.

For each sample the sign is removed at step 121 by taking the absolute value of the sample and assigning it to 'v'. The existing envelope is then allowed to decay at step 122 according to the value of the 'decay' parameter. This is an exponential decay towards zero. If 'v' does not exceed the decayed envelope value 'env' we have the value to be used. If it does exceed 'env', determined at step 123, then the new value for env is calculated at step 124. Effectively the value of env is increased towards the value v according to the 'attack' parameter. This would represent an asymptotic growth if the incoming sample values were consistently higher than 'env'.

Finally at 125 the value of env is used instead of the sample value in the algorithm of FIG. 10 to determine the impulse response to be used in the system and the proportions k (in FIG. 10) of each adjacent impulse response to use. Finally the values S.(1−k) and S.k are calculated at the penultimate step of FIG. 10, using the input sample value for S as before to generate the $F_1$ and $F_2$ values used for calculating the output sample value. The system is ready for the next input sample.

A useful improvement is to store the previous n input samples, and after calculation of the 'env' variable based on the current input sample, to use the input sample value read in n steps previously to generate the output sample, saving the current input sample for n iterations. This allows a sudden increase in input signal to allow the 'env' variable to increase appropriately over a number of steps before the first high level input sample is actually applied to the simulation algorithm. A disadvantage is that this introduces an overall delay into the system. Once again this value of n is usefully made a user controllable value.

Typical values of attack and decay are 10 and 1000 respectively resulting in a rapid adoption of a higher level impulse response when the input signal increases in general amplitude coupled with a slower return to lower amplitude values when the general signal level decays. 'n' can be made variable from 0 up to several time 'attack'.

Where the original device under test contained in-built audio dynamic compression characteristics (e.g. a 'compressor limiter' device) this approach of impulse response selection based on envelope more accurately simulates the way the device under test alters its tonal characteristics and gain at different levels of applied signal.

Order of Processing Derived Impulse Responses

There has been described a number of operations to be performed on the impulse response data resulting from analysing a device under test. It is necessary to first apply the de-jitter algorithm if this is necessary. Noise measurement and substitution to reduce noise is best performed next. Since the signal has not yet been normalised it is necessary to reduce a higher level impulse response data in proportion when substituting in a lower level impulse response. At this stage the difference signal should be derived if a step analysis pulse was used. Following this the impulse responses should be normalised, and then any smoothing between responses is performed. Finally the responses should be windowed as described.

Further Uses

The process described can be used to simulate effect which are asymmetric by also taking into account the sign of the signal to be processed and taking separate analysis samples for positive going test pulses and negative going test pulses. This asymmetric processing could be appropriate, for example, to simulation of high sound pressure level effects in air where the sound carrying capacity of air is asymmetric.

A further use of the process of selecting between impulse responses is for using some other characteristic than the amplitude of the incoming sample to control selection.

For example a number of different effects can be placed into each impulse response memory and be selected between (including using the cross-fading technique) under user control or in a repetitive manner using a control oscillator. In this way a time varying effect can be simulated, for example a rotating Leslie loudspeaker cabinet or a varying flanger or phaser effect. The required impulse responses can either be calculated to generate an effect or an existing unit can be sampled at a number of different settings representing a range which the effect is normally used to sweep through. Thus a Leslie loudspeaker can be analysed at a number of different static positions of the rotating speaker and the resulting set of impulse responses stored. Then cycling through the responses will simulate rotation of the speaker (including the doppler effects of the moving speaker as different impulses responses will have different delays built in representing different direct and indirect signal paths from the loudspeaker analysed).

A refinement of the process allows the combination of non-linear effects with time varying or user controlled effects. In this case instead of one set of impulse responses which are amplitude dependent, a number of sets are stored. The amplitude of the incoming signal determines which impulse response of a set to use, and the time varying or user adjusted parameter selects between sets. To perform smooth cross-fading between effects the interpolator function of FIG. 5 is enhanced to provide a two-dimensional, or bilinear, interpolation between 4 impulse responses with one dimension dependent on signal amplitude and the other dependent on the other parameter. It is of course possible to increase the number of parameters which can be varied simultaneously still further. This is limited by the processing power required to perform the multi-linear interpolation and the storage capacity for the number of impulse response sets required.

Although a monophonic system is described typically two units will run in parallel to allow stereo in and stereo out. Often the input signal will be the same applied to both channels to generate stereo simulated effects from monophonic sources.

It was mentioned that audio processing is used in film dubbing, and example of use of the invention is as follows: Once the effect on an actor's voice has been decided upon in a film production to match the studio recording to the appropriate sound for the scene, the entire process through which the voice track is passed can be analysed and stored. In this case whenever it is necessary to re-record the sound track, for example when dubbing into a foreign language, the effect can be recalled and applied to the relevant speech for the appropriate scene. Thus a film would be made available for dubbing with the audio process for each scene and each voice stored and indexed to speed up the dubbing process.

Non Real Time and General Purpose Computers

Note that it is also possible to process in non-real time using less hardware and this can be done on typical general purpose desk-top computers. However the best use is achieved when operating in real-time whether this is on a high performance general purpose computer implementing the algorithms described or by means of dedicated multiple DSP architectures.

Deriving Impulse Responses from Virtual Systems

It should be noted that as well as sampling existing effects it is quite possible to generate a computer model of a new device and calculate a set of impulse responses. These may then be loaded into the simulator to allow the effect to be auditioned in real-time. In this way the simulator can emulate arbitrary digital effects such as equalisers, or simulated physical models e.g. room simulations, and especially non-linear devices such as amplifier or loudspeaker simulations.

In the case of simple equalisers which are linear in character only one impulse response is generated for any chosen equaliser. These can be calculated and loaded rapidly to allow real-time variation of equaliser characteristics. The simulator thus provides a powerful simulator of a wide range of equaliser devices complete with real-time user control of parameters. In practice when a parameter is varied the new impulse response is calculated and loaded and a cross-fade can be performed to the new effect to remove switching effects when parameters are varied. This can be extended to include non-linear processes by using the multi-dimensional approach described.

What is claimed is:

1. A method for applying a gain characteristic derived from an original sampled device to an audio signal comprising the steps of:

storing data representing a plurality of gain characteristics at a plurality of different levels;

repeatedly assessing the amplitude of an input signal;

determining a level of gain characteristic to be applied to the input signal; and applying the thus determined gain characteristic comprises multiplying the input signal by the thus determined gain characteristic and convolving the results with a stored impulse response.

2. A method according to claim 1 in which the gain characteristic to be applied to an input signal is determined in response to a manual input.

3. A method according to claim 1 in which an interpolation between two or more impulse responses is made and applied to the input signal.

4. A method according to claim 3 in which a manual input is used to select the impulse responses to be applied.

5. A method according to claim 1 in which the gain characteristic corresponds to a gain characteristic of an audio signal processor.

6. Apparatus for applying a gain characteristic derived from an original sampled device to an audio signal comprising:

means for storing data representing a plurality of gain characteristics at a plurality of different levels;

means for repeatedly assessing the amplitude of an input signal;

means for determining a level of gain characteristic to be applied to the input signal; and means for applying the thus determined gain characteristic to the input signal by multiplying the input signal by the determined level of gain characteristic and convolving the result with a stored impulse response.

7. Apparatus according to claim 6 including a manual input for a gain characteristic to be applied to an input signal.

8. Apparatus according to claim 6 including means for interpolating between two or more impulse responses before applying the interpolated response to the input signal.

9. Apparatus according to claim 8 including a manual input to select the impulse response to be applied.

10. Apparatus according to claim 6 in which the gain characteristic corresponds to a gain characteristic of an audio signal processor.

11. A method for applying a gain characteristic to an audio signal comprising the steps of:

storing data representing a plurality of gain characteristics of a reference device at a plurality of different levels;

repeatedly assessing the amplitude of an input signal;

determining a gain characteristic to be applied to the input signal in response to a manual input; and using the thus determined gain characteristic to retrieve stored data representing said determined gain characteristic and applying said data to the input signal.

12. A method according to claim 11 in which the gain characteristic corresponds to a gain characteristic of an audio signal processor.

13. A method according to claim 11 wherein the step of storing data representing a plurality of gain characteristics comprises storing gain characteristics for at least two reference devices and the step of determining a gain characteristic to be applied to the input signal includes the step of selecting between the at least two reference devices.

14. Apparatus for applying a gain characteristic to an audio signal comprising:

means for storing data representing a plurality of gain characteristics of a reference device at a plurality of different levels;

means for repeatedly assessing the amplitude of an input signal;

means for determining a gain characteristic to be applied to the input signal in response to a manual input; and means for using the thus determined gain characteristic to retrieve stored data representing said determined gain characteristic and applying said data to the input signal.

15. Apparatus according to claim 14 in which the gain characteristic corresponds to a gain characteristic of an audio signal processor.

16. Apparatus according to claim 14 wherein the means for storing data representing a plurality of gain characteristics stores gain characteristics for at least two reference devices and the means for determining a gain characteristic to be applied to the input signal includes means for selecting between the at least two reference devices.

* * * * *